(12) United States Patent
Mizuno

(10) Patent No.: US 8,198,693 B2
(45) Date of Patent: Jun. 12, 2012

(54) SOLID-STATE IMAGE PICKUP APPARATUS AND PRODUCTION METHOD THEREOF

(75) Inventor: Ikue Mizuno, Kanagawa (JP)

(73) Assignee: Sony Corporation (JP)

(*) Notice: Subject to any disclaimer, the term of this patent is extended or adjusted under 35 U.S.C. 154(b) by 183 days.

(21) Appl. No.: 12/658,713

(22) Filed: Feb. 12, 2010

(65) Prior Publication Data

US 2010/0213559 A1 Aug. 26, 2010

(30) Foreign Application Priority Data

Feb. 25, 2009 (JP) .................. P2009-041751

(51) Int. Cl.
*H01L 29/72* (2006.01)
(52) U.S. Cl. ........... 257/432; 257/436; 257/466; 438/62
(58) Field of Classification Search .................. 257/432, 257/436, 466; 438/62
See application file for complete search history.

(56) References Cited

U.S. PATENT DOCUMENTS 5,943,463 A * 8/1999 Unuma et al. ................ 385/119

FOREIGN PATENT DOCUMENTS

| JP | 2008-010544 | * | 1/2008 |
| JP | 2008-010544 A | | 1/2008 |
| JP | 2008-175072 A | | 7/2008 |

* cited by examiner

*Primary Examiner* — Edward Wojciechowicz
(74) *Attorney, Agent, or Firm* — Lerner, David, Littenberg, Krumholz & Mentlik, LLP

(57) ABSTRACT

A solid-state image pickup apparatus includes: a substrate in which a charge generation portion that generates a signal charge is formed on a surface layer; a layer covering an upper surface of the substrate; a waveguide formed on the layer covering the upper surface of the substrate at a position corresponding to the charge generation portion; a hollow portion formed on the layer covering the upper surface of the substrate at a position on an outer side of the waveguide; and an optically-transparent layer formed on the layer covering the upper surface of the substrate such that at least the hollow portion becomes airtight.

16 Claims, 18 Drawing Sheets

(Solid-state image pickup apparatus 1Z of comparative example)

(1) Structure (cross section)

(2) Problem

Loss of collected light due to reflection of light by barrier insulation layer 130 through liner film 160 although light collection efficiency drops by miniaturization ⟨First embodiment⟩  * Forming of insulation layer 110 and metal wiring layer 120

(1) Cross section (2) Surface

⟨First embodiment⟩ *Patterning of resist 106

(1) Cross section (2) Surface

⟨First embodiment⟩ * Deposition of liner film 160 and sealing of opening of opening portion 152
It is better for liner film 160 to have larger refractive index than insulation layer 110 and larger refractive index difference (1) Cross section (2) Surface (3) Enlarged diagram (Second embodiment) * Forming of insulation layer 210 and metal wiring layer 220
Insulation layer 210 has lower permittivity than silicon oxide film SiO2
(1) Cross section (2) Surface ⟨Second embodiment⟩ * Patterning of resist 206

(1) Cross section (2) Surface (Second embodiment) * Simultaneous forming of opening portion 242 and opening portion 252

(1) Cross section (2) Surface

⟨Third embodiment⟩

(1) Cross section (2) Plane at liner film 360

⟨Third embodiment⟩

(1) * Patterning of resist 306

(2) * Simultaneous forming of opening portion 342 and opening portion 352

⟨Fourth embodiment⟩

(1) * Patterning of resist 406

(2) * Simultaneous forming of opening portion 442 and opening portions 452

SOLID-STATE IMAGE PICKUP APPARATUS AND PRODUCTION METHOD THEREOF

CROSS-REFERENCE TO RELATED APPLICATION

The present application claims priority from Japanese Patent Application No. JP JP 2009-041751 filed in the Japanese Patent Office on Feb. 25, 2009, the entire content of which is incorporated herein by reference.

BACKGROUND OF THE INVENTION

1. Field of the Invention

The present invention relates to a solid-state image pickup apparatus and a production method thereof, more specifically, to a solid-state image pickup apparatus having a structure in which a waveguide is formed above a charge generation portion and a hollow portion (void portion) is provided around the waveguide, and a production method thereof.

2. Description of the Related Art

When incident light obliquely enters a charge generation portion (light-receiving portion) of a unit pixel of a solid-state image pickup apparatus, instead of entering a charge generation portion of a unit pixel that the light is supposed to enter, the light may enter a charge generation portion of an adjacent unit pixel different from that unit pixel due to stray light to be subjected to a photoelectric conversion. In this case, since the incident light cannot be used effectively in the original unit pixel, a sensitivity is lowered and image pickup characteristics between the adjacent pixels (inter-pixel crosstalk) are deteriorated.

As a countermeasure, there is proposed a solid-state image pickup apparatus that includes a hollow portion (air gap, gas layer) for collecting incident light at a charge generation portion to effectively use the incident light (see, for example, Japanese Patent Application Laid-open No. 2008-10544 (hereinafter, referred to as Patent Document 1) and Japanese Patent Application Laid-open No. 2005-175072 (hereinafter, referred to as Patent Document 2)). A leitmotif is a technique of guiding, by forming a hollow portion in an interlayer film or between a waveguide and the interlayer film and totally reflecting light using a refractive index difference between the interlayer film and the hollow portion, oblique incident light toward the charge generation portion to thus lower a possibility of the oblique incident light entering an adjacent pixel.

FIGS. 6 and 6A are diagrams for explaining a structure described in Patent Document 1. When producing a solid-state image pickup apparatus 1X, a charge generation portion 902 is first formed on a surface layer of a substrate 900 formed of a semiconductor material such as single-crystal silicon. Oxide films whose compositions are changed by differentiating etching rates so that the etching rates increase toward the upper layer are laminated on the substrate 900, that is, interlayer films having different etching rates are laminated (oxide-film laminating process). As an example, a BPTEOS film 911 is deposited as a lower layer on the substrate 900 side and a P—SiO film 912 formed by a plasma CVD method is deposited on the BPTEOS film 911 as an oxide film. Then, trenches are formed by dry etching processing (trench-forming process) (FIG. 6(1)). Subsequently, using a difference between the etching rates of the laminated interlayer films (BPTEOS film 911 and P—SiO film 912), a trench width of only the BPTEOS film 911 as the lower layer is intentionally widened by wet etching (selective trench-width widening process: FIG. 6(2)).

Next, a hollow portion 950 is formed by overhanging filling by CVD with poor coverage (filling process: FIG. 6(3)). However, since a streak (line) is formed in the hollow portion 950 with only the overhanging filling, etch back and deposition are repeated by HDP (High Density Plasma)-CVD to thus close up the streak.

Patent Document 1 also discloses an example of forming a hollow portion 950 to be higher than an upper-layer wiring as in a solid-state image pickup apparatus 1Y shown in FIG. 6A.

In Patent Document 2, after forming a dummy film for forming a hollow portion after processing a waveguide and filling an organic dielectric film after removing the unnecessary dummy film at the bottom of the waveguide, a part of the interlayer film at an upper layer of the dummy film at an opening portion of the waveguide is etched selectively to expose the dummy film. By selectively etching only the dummy film using gas that has F (fluorine) or Cl (chlorine) as a main component of etching, such as CF4 and CCl4, for example, a hollow portion is formed. Further, by forming, after forming the hollow portion by selectively etching the dummy film, a thin liner film at a side wall portion by a P-CVD (plasma CVD) method or a UV-CVD (ultraviolet light CVD) method at low temperature while using a difference in deposition rates between the waveguide opening portion and the side wall portion, an opening of the waveguide opening portion is closed up.

SUMMARY OF THE INVENTION

The structure of Patent Document 1 has disadvantages that since the oxide-film laminating process, the trench-forming process, the selective trench-width widening process, and the filling process are necessary, the number of processes becomes large and costs are thus increased. In the structure of Patent Document 2, the number of processes is markedly increased as compared to the process of the related art, and there is a fear that costs may increase as in Patent Document 1. The problems on the number of processes are referred to as first problem.

In view of the first problem, there is a need for a structure that is capable of reducing the number of processes to be smaller than those of Patent Documents 1 and 2 in producing a solid-state image pickup apparatus that includes a waveguide and a hollow portion for collecting incident light at a charge generation portion and effectively using the incident light.

According to an embodiment of the present invention, there is provided a solid-state image pickup apparatus including: a substrate in which a charge generation portion that generates a signal charge is formed on a surface layer; a layer covering an upper surface of the substrate; (an opening portion for) a waveguide formed in the layer covering the upper surface of the substrate at a position corresponding to the charge generation portion; (an opening portion for) a hollow portion formed in the layer covering the upper surface of the substrate at a position on an outer side of the waveguide; and an optically-transparent layer formed on the layer covering the upper surface of the substrate such that at least the hollow portion becomes airtight.

According to another embodiment of the present invention, there is provided a method of producing a solid-state image pickup apparatus, including the steps of: forming, on a substrate in which a charge generation portion that generates a signal charge is formed on a surface layer, a layer covering an upper surface of the substrate; forming in the layer covering the upper surface of the substrate, an opening portion for a waveguide at a position corresponding to the charge generation portion and an opening portion for a hollow portion on an outer side of the waveguide; and forming an optically-transparent layer on the layer covering the upper surface of the substrate and sealing an opening of the opening portion for the hollow portion by the optically-transparent layer such that the opening portion becomes airtight. In other words, this embodiment has characteristics that the waveguide and the hollow portion are formed at the same time. It is desirable for the opening portion for the waveguide to be filled with an optically-transparent material.

Since the hollow portion can be formed simultaneous with the waveguide in the step of forming the waveguide, a step of forming a hollow portion does not need to be provided in addition to the process of forming the waveguide as compared to the related art. In addition, since the material of the layer covering the upper surface of the substrate is interposed between the waveguide and the hollow portion, the number of reflection interfaces is increased as compared to Patent Document 2.

According to the embodiments of the present invention, a solid-state image pickup apparatus including a waveguide and a hollow portion can be produced with a smaller number of processes than in Patent Documents 1 and 2. Therefore, an effect of cutting costs can be expected.

In addition, an effect of causing light that has deviated from a charge generation portion to return to the charge generation portion without omission is enhanced as compared to Patent Document 2.

These and other objects, features and advantages of the present invention will become more apparent in light of the following detailed description of best mode embodiments thereof, as illustrated in the accompanying drawings.

DESCRIPTION OF PREFERRED EMBODIMENTS

Hereinafter, embodiments of the present invention will be described specifically with reference to the drawings. It should be noted that numerical values that originally should be expressed using subscripts in describing materials are represented by half-size numerical values without using subscripts.

Descriptions will be given in the following order.
1. Comparative example and problem thereof
2. Basics of production methods according to embodiments of present invention
3. First embodiment (one hollow portion on inner side of light-receiving portion: interlayer insulation film is silicon oxide film)
4. Second embodiment (one hollow portion on inner side of light-receiving portion: interlayer insulation film is film having lower permittivity than silicon oxide film)
5. Third embodiment (one hollow portion on outer side of light-receiving portion: interlayer insulation film is silicon oxide film)
6. Fourth embodiment (plural hollow portions: interlayer insulation film is silicon oxide film)

COMPARATIVE EXAMPLE AND PROBLEM THEREOF

Figure 1:
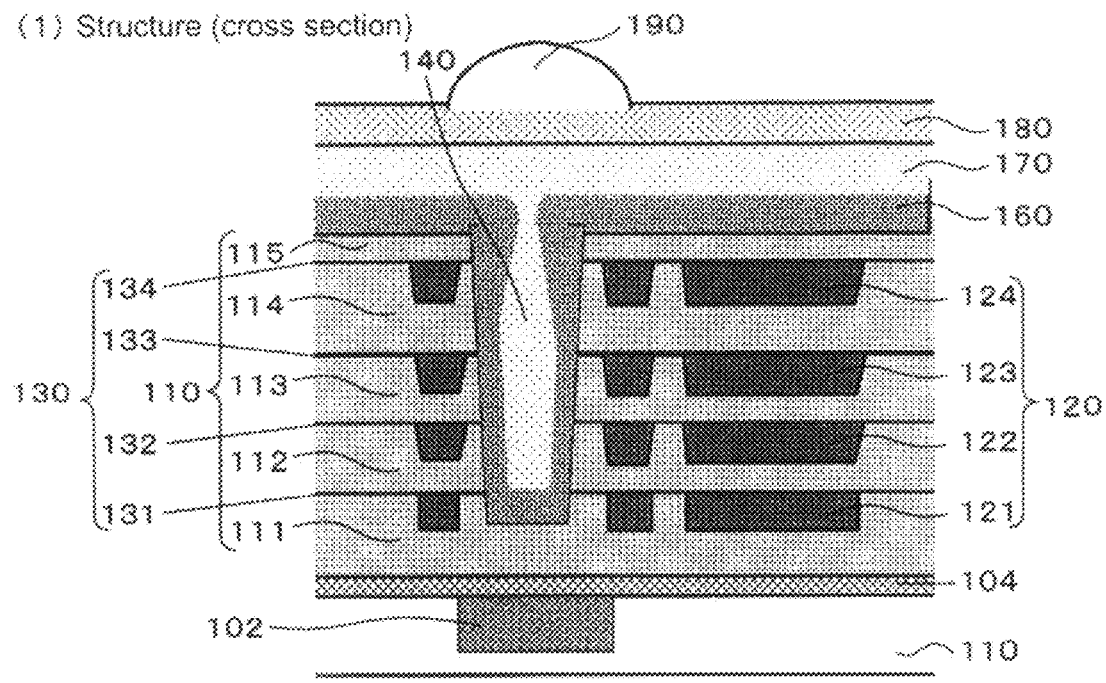
FIG. 1 are diagrams for explaining a comparative example of an embodiment of the present invention.
Figure 1:
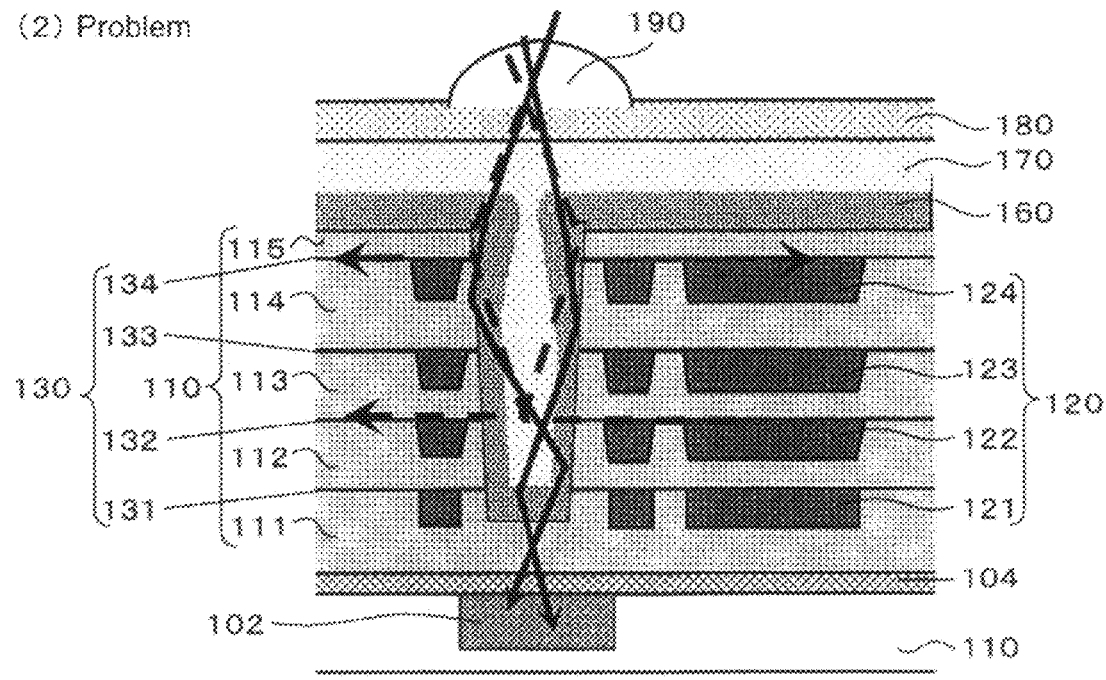

FIG. 1 are diagrams for explaining a comparative example with respect to embodiments of the present invention.

In recent years, in a solid-state image pickup apparatus, it is becoming increasingly difficult to efficiently collect light that has entered a microlens at a light-receiving portion, due to a progress in a miniaturization of pixels.

Structure of Comparative Example

For example, a solid-state image pickup apparatus 1Z of the comparative example shown in FIG. 1 are for a color image pickup in which a waveguide is applied to a copper (Cu) wiring structure. Using the copper wiring structure for a metal wiring layer is for lowering a wiring resistance.

On a substrate 100, a charge generation portion 102 as a light-receiving portion and an unillustrated transfer gate, charge transfer portion, and pixel signal generation portion are formed. An insulation layer 104 is formed on the substrate 100 including the charge generation portion 102. The insulation layer 104 is used as an etching stopper film.

An insulation layer 110 is formed on the insulation layer 104. Specifically, the insulation layer 110 includes a plurality of interlayer insulation films (5 layers 111 to 115 in this example). The insulation layer 110 is used for forming a metal wiring layer 120 (4 layers 121 to 124 in this example).

The metal wiring layer 120 has a copper wiring structure. When a waveguide 140 is applied, for suppressing lowering of reliability due to a Cu ion diffusion, a barrier insulation layer 130 (4 layers 131 to 134 in this example) is provided between the insulation layer 110 and the metal wiring layer 120.

The waveguide 140 is formed in a part of the insulation layer 110 above the charge generation portion 102. For example, an opening portion 142 is provided, and a liner film 160 that integrally covers a side wall of the opening portion 142 and an uppermost portion of the insulation layer 110 (interlayer insulation film 115 in this example) is formed. In other words, the liner film 160 is formed with respect to the waveguide 140. Moreover, an optically-transparent layer 170 formed of an optically-transparent material is provided so as to fill the opening portion 142 covered by the liner film 160 and also cover the liner film 160 on the interlayer insulation film 115.

Since the solid-state image pickup apparatus 1Z is for a color image pickup, on the optically-transparent layer 170, a color separator filter 180 and a microlens 190 are provided in the stated order at a position corresponding to the charge generation portion 102 (i.e., opening portion 142).

Problem of Comparative Example

Here, when incident light enters the charge generation portion 102 of the solid-state image pickup apparatus 1Z in an oblique direction as shown in FIG. 1(2), the incident light may enter, instead of entering the charge generation portion 102 of a unit pixel that the light is supposed to enter, the charge generation portion 102 of an adjacent unit pixel different from that unit pixel due to stray light to be subjected to a photoelectric conversion.

Moreover, while the barrier insulation layer 130 is formed in this example, in a recent simulation evaluation, there is also data that shows that light collected inside the waveguide 140 passes through the liner film 160 to proceed to the barrier insulation layer 130. Thus, it can be seen that it is difficult to secure a light collection efficiency by merely setting the waveguide 140.

The problems as described above lead to lowering of a sensitivity since incident light cannot be used effectively in an original unit pixel, with the result that image pickup characteristics between adjacent pixels are deteriorated (inter-pixel crosstalk).

In a structure of Japanese Patent Application Laid-open No. 2008-10544 (hereinafter, referred to as Patent Document 1), although a groove width of a hollow portion is formed to be about 200 nm, if a pixel miniaturization progresses, an area of the hollow portion and an area occupied in a step of forming trenches as a previous process become too large even when pixel transistors and wirings are miniaturized. Thus, there is a fear that the structure cannot be applied in terms of layout. In a structure of Japanese Patent Application Laid-open No. 2005-175072 (hereinafter, referred to as Patent Document 2), a hollow portion is formed by selectively etching only a dummy film using gas that has F (fluorine) or Cl (chlorine) as a main component of etching, such as CF4 and CCl4. However, since an aspect ratio of a waveguide increases as the pixel miniaturization progresses, there is a fear that etching gas may be unable to reach the dummy film in the vicinity of a bottom portion of the waveguide, with the result that the hollow portion cannot be formed. The problem on the layout surface regarding the pixel miniaturization will be referred to as second problem.

(Basics of Production Methods According to Embodiments of Present Invention)

As a countermeasure against the problems above, the embodiments of the present invention adopt a structure that includes a hollow portion for collecting incident light at a charge generation portion and effectively using the incident light. A light collection efficiency is enhanced by a combination of the waveguide technique and the hollow portion technique. In this case, a structure that is capable of solving the problem on the layout surface (second problem) in the case where the pixel miniaturization progresses in Patent Documents 1 and 2 and reducing the number of processes as compared to Patent Documents 1 and 2 is used.

A basic idea is characterized by forming a waveguide and a hollow portion at the same time. Since the waveguide and the hollow portion can be formed at the same time even when using a normal waveguide process flow, a process does not need to be newly added. Further, since both the waveguide and the hollow portion exist, the number of refection interfaces becomes two or more. With this structure, since light that has passed through and exited the waveguide up to now can be totally reflected by an interface between the hollow portion and the interlayer film and caused to return to the waveguide, an enhancement of a light collection efficiency can be expected. Also with respect to the light that has passed through the liner film 160 to proceed to the barrier insulation layer 130 as indicated by the simulation result, since the barrier insulation layer 130 is automatically broken due to forming of the hollow portion, the light cannot escape, with the result that the light can be positively caused to return to the waveguide 140.

In addition, since the hollow portion has an effect of blocking stray light from entering an adjacent pixel, it is possible to suppress a color mixture (color and luminance crosstalk) in a color image pickup structure and also suppress luminance crosstalk in a monochrome image pickup structure.

Moreover, the second problem can be solved by forming, in a process of sealing an opening of an opening portion of the hollow portion such that the opening portion becomes airtight, a protective layer such that an upper surface of the insulation layer 110 and a wall surface of (an opening portion for) the waveguide 140 are covered therewith and an opening of (an opening portion for) the hollow portion is sealed such that the opening portion for the hollow portion becomes airtight. Particularly in the process of forming the protective layer, a material of the protective layer and manufacturing conditions on a gas flow ratio, high-frequency power, a pressure, a temperature, and the like are set so that the protective layer is overhung at the opening of the opening portion for the hollow portion to thus seal the opening of the opening portion for the hollow portion such that the opening portion becomes airtight. Desirably, the material of the protective layer and the manufacturing conditions on a gas flow ratio, high-frequency power, a pressure, a temperature, and the like are set so that the opening of (the opening portion for) the waveguide 140 is not sealed when the protective layer is overhung at the opening. In other words, the material and manufacturing conditions are set so that the protective layer can be formed with favorable coverage on the waveguide 140 and overhang is caused at the hollow portion so that the opening portion is not filled.

Hereinafter, a structural example and an example of a production method will be described in detail.

(First Embodiment)

Figure 2:
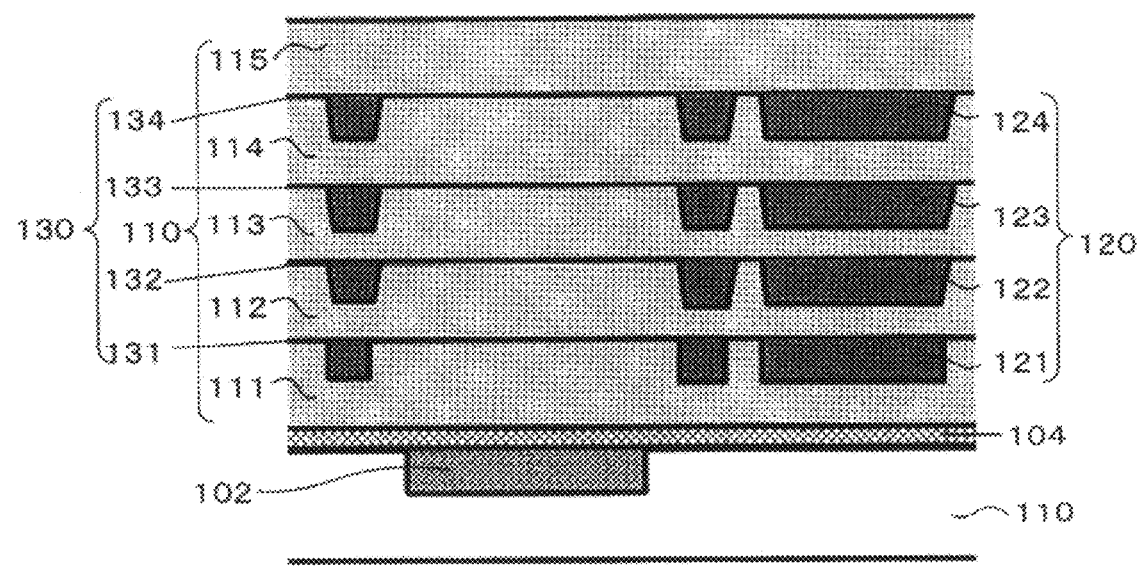
FIG. 2 are diagrams for explaining a first embodiment.
Figure 2:
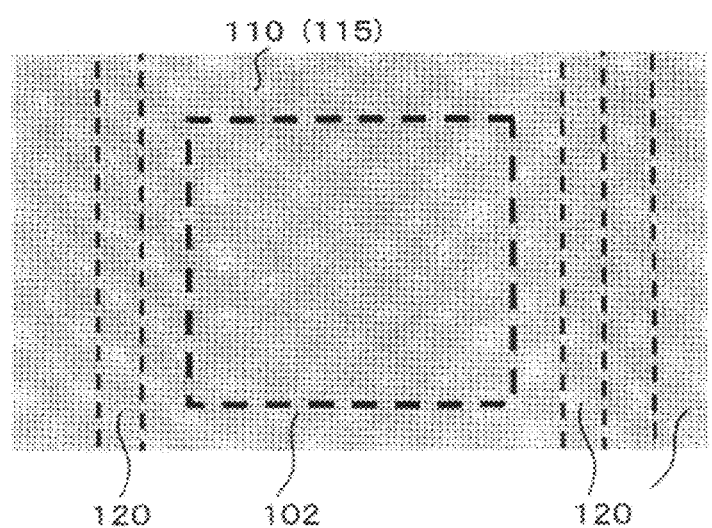
Figure 2A:
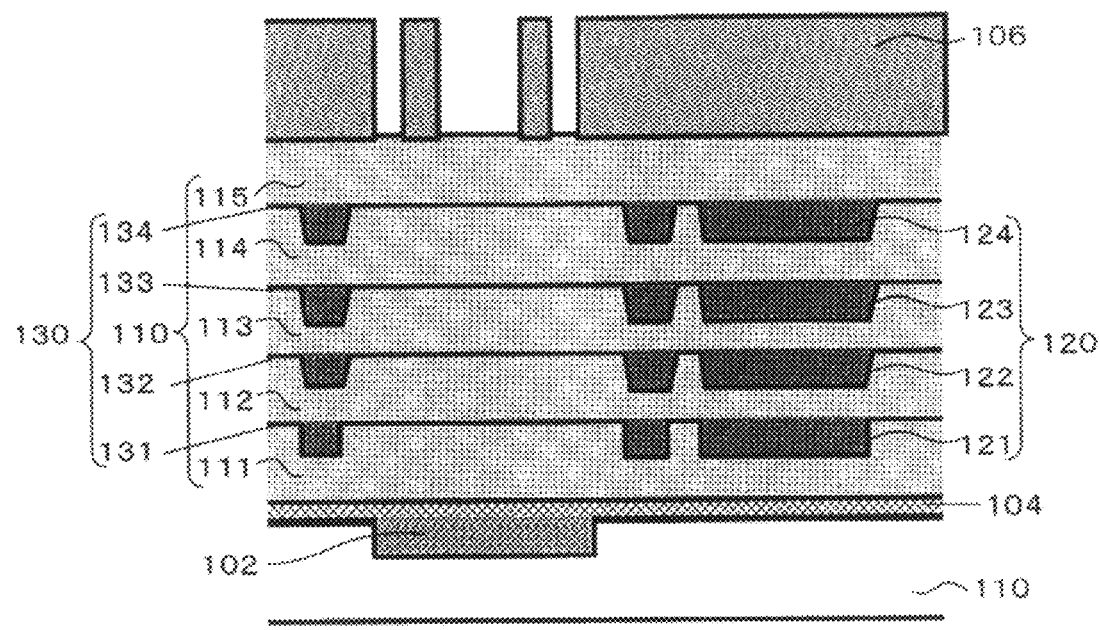
FIG. 2A are diagrams for explaining the first embodiment.
Figure 2A:
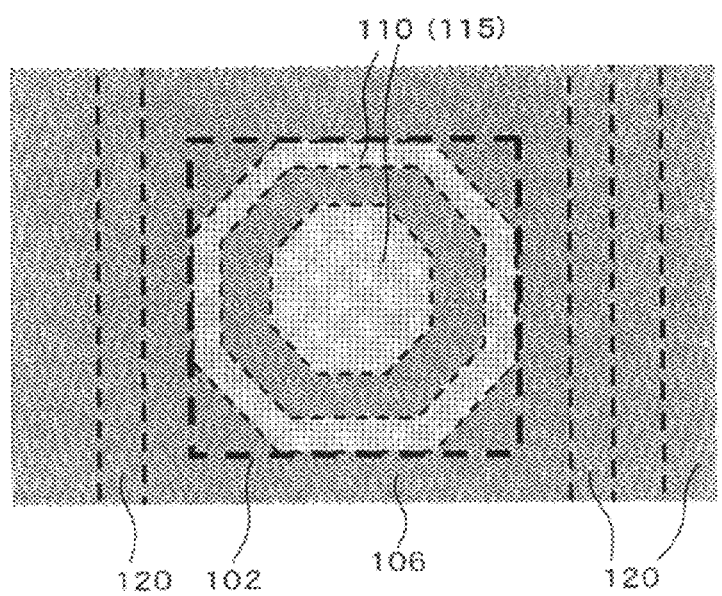
Figure 2B:
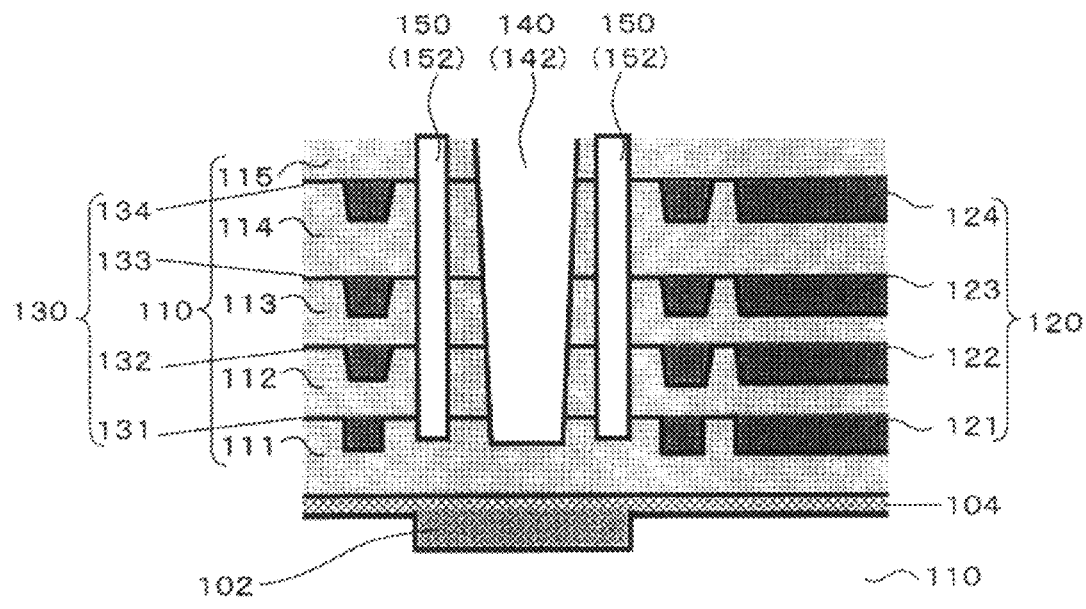
FIG. 2B are diagrams for explaining the first embodiment.
Figure 2B:
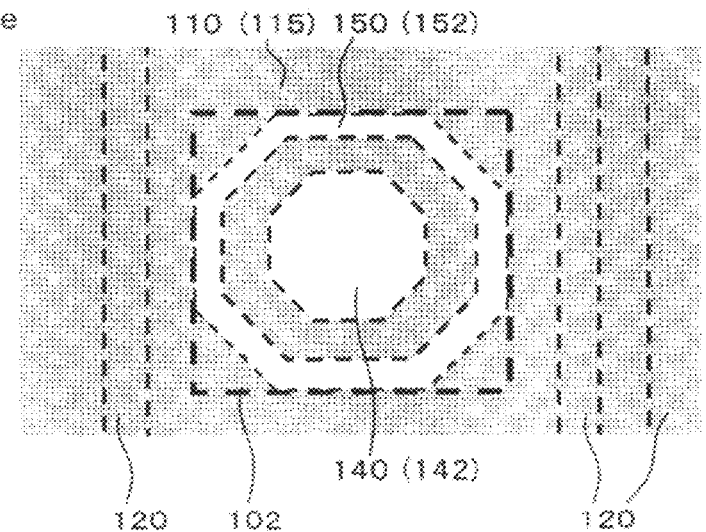
Figure 2C:
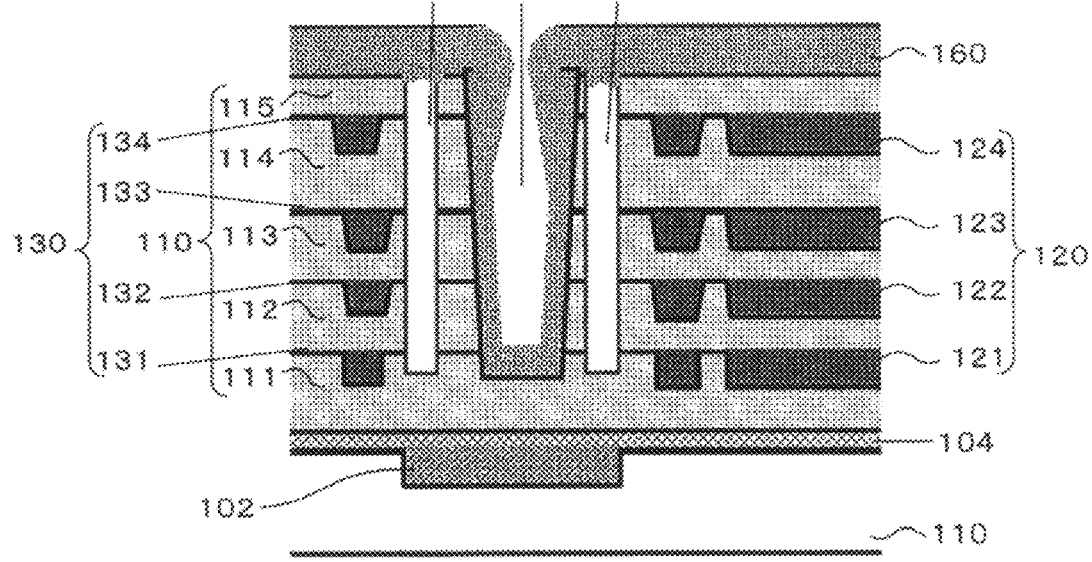
FIG. 2C are diagrams for explaining the first embodiment.
Figure 2C:
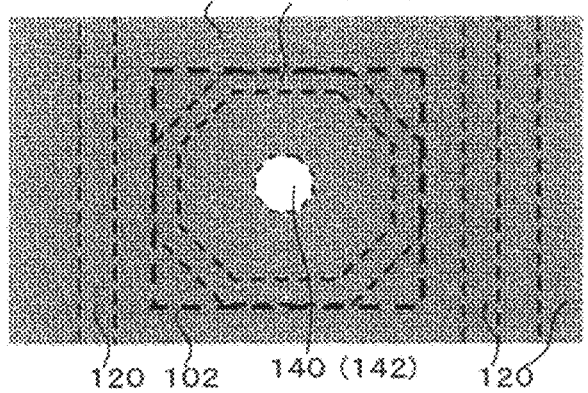
Figure 2C:
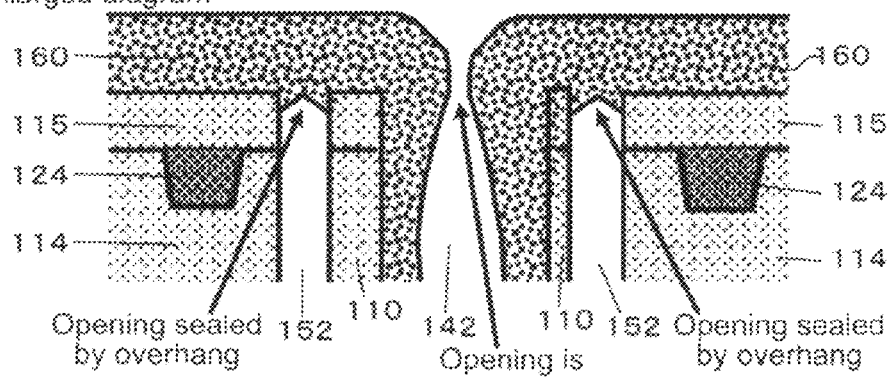
Figure 2D:
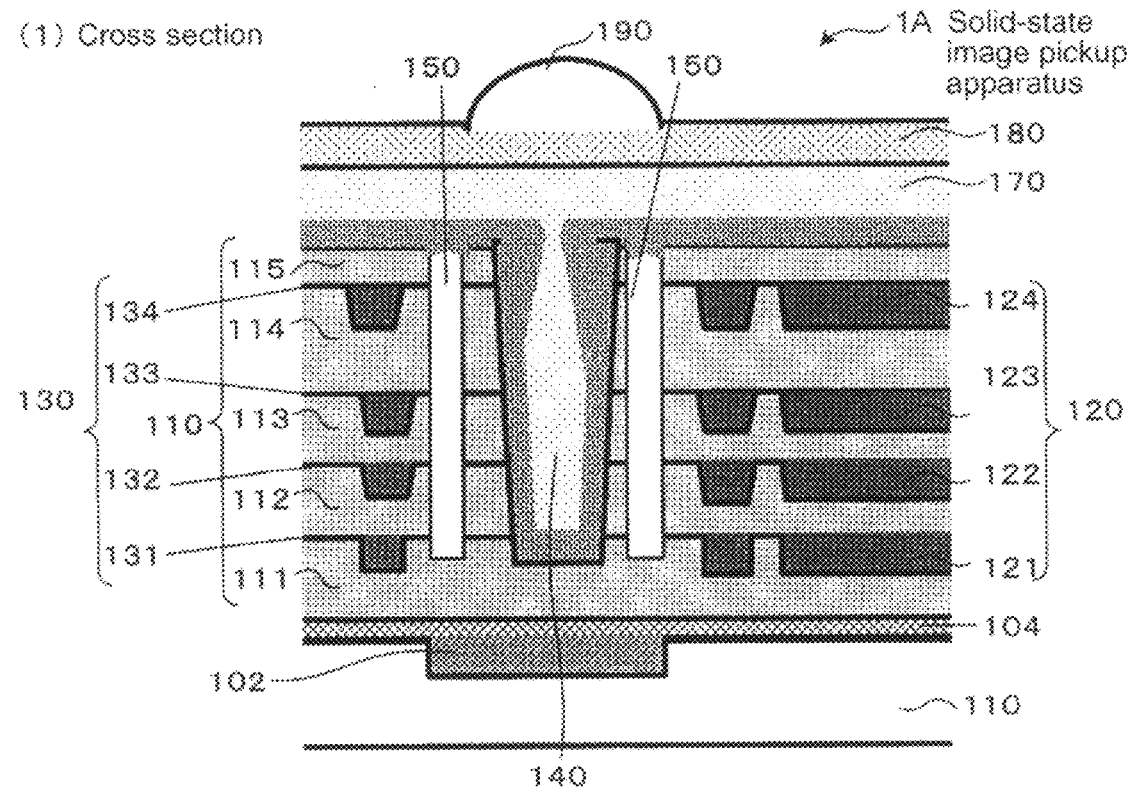
FIG. 2D is a diagram for explaining the first embodiment.

FIGS. 2 to 2D are diagrams for explaining a first embodiment. A solid-state image pickup apparatus 1A of the first embodiment has characteristics that one hollow portion is provided annularly on an inner side of the charge generation portion 102 and a silicon oxide film is used as the interlayer insulation film. The term "annular" only needs to refer to a state where a ring is generally formed as a whole, and the ring may be partially broken.

As shown in FIG. 2, the charge generation portion 102 is formed on a surface layer of the substrate 100 formed of a semiconductor material such as single-crystal silicon. Although illustrations are omitted, on the substrate 100, a diffusion layer constituting a floating area to which a signal charge generated by the charge generation portion 102 is carried, a pixel signal generation portion constituted of a plurality of transistors, and the like are formed in addition to the charge generation portion 102, for example.

Next, the insulation layer 104 is formed on the substrate 100. On the insulation layer 104, the insulation layer 110 constituted of the interlayer insulation films 111 to 115, the metal wiring layer 120 (121 to 124) formed inside the interlayer insulation films 111 to 114, and the barrier insulation layer 130 (131 to 134) provided between the adjacent interlayer insulation films 111 to 115 are formed successively from the lower layer side. The metal wiring layer 120 has a copper wiring structure.

The barrier insulation layer 130 functions as a Cu surface protective film (and anti-Cu-diffusion film) for preventing the surface of the metal wiring layer 120 buried into the insulation layer 110 from being oxidized. In fact, the metal wiring layer 120 is formed so that it is not provided above the charge generation portion 102.

The number of layers of the interlayer insulation films 111 to 115 constituting the insulation layer 110, the metal wiring layer 120, and the barrier insulation layer 130 are mere examples. As long as it is a wiring structure necessary for embodying the solid-state image pickup apparatus, the number of layers of the insulation layer 110 and the metal wiring layer 120 and the barrier insulation layer 130 formed via the insulation layer 110 can be increased or decreased.

Here, a silicon oxide film SiO2 is used as the insulation layer 110 (interlayer insulation films 111 to 115), for example.

Next, as shown in FIG. 2A, patterning is performed to form the waveguide 140 and a hollow portion 150 at a position facing the charge generation portion 102. When a pixel pitch is about 1.75 to 1.1 μm pitch, it is desirable for a groove constituting the hollow portion 150 to have a width smaller than 100 nm. A planar shape of the waveguide 140 and the hollow portion 150 is, for example, an octagon.

When performing the patterning for forming the waveguide 140 and the hollow portion 150, a method of applying a resist 106 onto the interlayer insulation film 115 first and disposing a resist mask right above the resist 106 to thus perform exposure (proximity method) is adopted, for example. Alternatively, a method of separating the resist mask from the resist 106 and performing projection (projection method) may be used.

The resist 106 may either be a positive type that removes a part exposed to light or a negative type that removes a part unexposed to light. In either case, in the patterned state, the resist 106 does not exist at a part corresponding to the waveguide 140 and a part corresponding to the hollow portion 150. The first embodiment is different from a third embodiment to be described later in that the patterning is performed in a state where the resist 106 does not exist at the part corresponding to the hollow portion 150 so that one hollow portion 150 is formed on an inner side of an outer edge of the charge generation portion 102.

Next, as shown in FIG. 2B, by opening (the interlayer insulation films 111 to 115 of) the insulation layer 110 and the barrier insulation layer 130 (131 to 134) by a dry etching method, an opening portion 142 is formed at the part corresponding to the waveguide 140, and an opening portion 152 is formed at the part corresponding to the hollow portion 150. In other words, in the opening portion forming process, the hollow portion 150 is formed simultaneous with the processing of the waveguide 140.

It should be noted that a size of the opening of the opening portion 142 is larger than that of the opening of the opening portion 152 (e.g., 3 to 5 times). The lower limit "3" is specified from the point of realizing both the positive formation of a side wall film with respect to the waveguide 140 and prevention of filling of the groove of the hollow portion 150, and the upper limit "5" is specified so that the width of the hollow portion 150 is not made too small. If the current liner condition is applied to the waveguide 140 and the hollow portion 150 having this ratio maintained, it is considered that there is almost no effect of a process variation. The side wall film can be formed on the waveguide 140 with favorable coverage, and the groove of the hollow portion 150 can be prevented from being filled by causing overhang with respect to the hollow portion 150. 3 to 5 times is a mere example, and the values of the lower limit "3" and the upper limit "5" only need to be adjusted in accordance with the manufacturing conditions and materials based on a meaning of the specifications above.

For example, the following conditions are conceivable in a case where a silicon oxide film SiO2 is used as the insulation layer 110. A flow ratio of octafluorocyclopentene C5F8, argon Ar, oxygen O2, and carbon monoxide CO is set to be 1:5:1:1, a pressure is set to be 5.3 Pa (pascal), source power is set to be 2500 W, a substrate bias is set to be 2000 W, a substrate temperature is set at room temperature, and an etching time is set to be about 7 minutes. Accordingly, the opening portion 142 for the waveguide 140 and the opening portion 152 for the hollow portion 150 are formed at the same time.

Next, as shown in FIG. 2C(1), the liner film 160 as an example of the protective layer that integrally covers a wall surface of the opening portion 142 and an uppermost portion of the insulation layer 110 (interlayer insulation film 115 in this example) is formed. A material of the liner film 160 is desirably an optically-transparent material having a higher refractive index than the insulation layer 110, more desirably an optically-transparent material having a larger refractive index difference with respect to the material of the insulation layer 110.

The material and production method are selected so that, even when any of the materials is used for the liner film 160, the side wall film can be formed on the opening portion 142 with favorable coverage and overhang is caused with respect to the opening portion 152 so that the opening portion 152 is not filled as shown in FIG. 2C(3). This is for the purpose of forming the hollow portion 150 such that the material of the liner film 160 is deposited on the wall surface (side wall and bottom surface) of the opening portion 142 without omission and the material of the liner film 160 is prevented from entering and filling the opening portion 152 by actively using the overhang phenomenon. Simultaneous with the process of forming the liner film 160 as the protective layer with respect to the opening portion 142 of the waveguide 140, the opening of the opening portion 152 is sealed using the overhang phenomenon while keeping the hollow portion 150 airtight.

Desirably, the opening of the opening portion 142 for the waveguide 140 is not sealed by the overhang phenomenon. This is because, if the opening of the opening portion 142 is sealed, the waveguide 140 cannot be filled with the optically-transparent material of the optically-transparent layer 170. However, even if the opening of the opening portion 142 is sealed, the inside of the waveguide 140 only becomes airtight, and the function as the waveguide 140 is maintained.

When the silicon oxide film SiO2 is used as the insulation layer 110, a silicon nitride film P—SiN formed by, for example, a plasma CVD method is favorably used as the liner film 160. Manufacturing conditions (production method) of the liner film 160 at this time are as follows. A gas flow ratio of silane SiH4, ammonia NH3, and nitrogen N2 is set to be 1:1:20, high-frequency power is set to be 800 W, a pressure is set to be 660 Pa (pascal), a temperature is set at 400° C., and a time is set to be about 1.5 minutes.

Next, as shown in FIG. 2D, the optically-transparent layer 170 is formed such that the inside of the waveguide 140 (opening portion 142 covered by liner film 160) is filled therewith and the liner film 160 on the interlayer insulation film 115 is also covered therewith. In other words, the opening portion 142 is partially filled with the optically-transparent liner film 160 that integrally covers the wall surface of the waveguide 140 and the upper surface of the insulation layer 110 (interlayer insulation film 115), and the rest is filled with the optically-transparent material constituting the optically-transparent layer 170, that is different from the material of the liner film 160.

An example of the material of the optically-transparent layer 170 is a material having a high optical transmittance such as an acrylic or fluorinated polymer, siloxane of an organic silicon polymer, and polyallylene PAr.

Next, as shown in FIG. 2D, in the case of an application to a color image pickup, the color separator filter 180 and the microlens 190 are formed on the optically-transparent layer 170 in the stated order at a position corresponding to the charge generation portion 102 (i.e., opening portion 142). Accordingly, the solid-state image pickup apparatus 1A of the first embodiment is obtained. In the case of a monochrome image pickup, the color separator filter 180 is unnecessary.

As can be seen from the descriptions above, the structure of the first embodiment has characteristics that the opening portion 142 for the waveguide 140 and the opening portion 152 for the hollow portion 150 are formed at the same time after forming the insulation layer 110 on the substrate 100. Since the opening portion 152 for the hollow portion 150 is formed simultaneous with the opening portion 142 for the waveguide 140 in the process of forming the opening portion 142 for the waveguide 140 of the related art, a process of forming the opening portion 152 does not need to be newly added.

Using the refractive index difference between the liner film 160 and the insulation layer 110, an effect of totally reflecting light that has passed through and exited the waveguide 140 (liner film 160) by the interface between the liner film 160 and the insulation layer 110 and causing the light to return to the waveguide 140 can be expected. Moreover, the liner film 160 also has an effect of suppressing corrosive deterioration by preventing water from entering the metal wiring layer 120 and an effect of preventing the optically-transparent layer 170 formed thereafter from being deteriorated.

In addition, due to the waveguide 140 and the hollow portion 150, the number of reflection interfaces becomes two or more. With this structure, since light that has passed through and exited the waveguide 140 in a case where this embodiment is not applied can be totally reflected by the interface between the hollow portion 150 and the insulation layer 110 and caused to return to the waveguide 140, an enhancement of the light collection efficiency can be expected.

Also with respect to the light that has passed through the liner film 160 to proceed to the barrier insulation layer 130, since the barrier insulation layer 130 is automatically broken due to forming of the hollow portion 150, the light cannot escape, with the result that the light can be positively caused to return to the waveguide 140. In addition, since the hollow portion 150 has an effect of blocking stray light from entering an adjacent pixel, it is possible to suppress a color mixture (color and luminance crosstalk) in the color image pickup structure.

Comparing with Patent Document 2, there are characteristics that the insulation layer 110 is interposed between the waveguide 140 and the hollow portion 150. Since the number of reflection interfaces is increased as compared to Patent Document 2 due to the insulation layer 110 being interposed between the waveguide 140 and the hollow portion 150, an effect of causing light that has deviated from the charge generation portion 102 to return to the charge generation portion 102 without omission is enhanced as compared to Patent Document 2.

(Second Embodiment)

Figure 3:
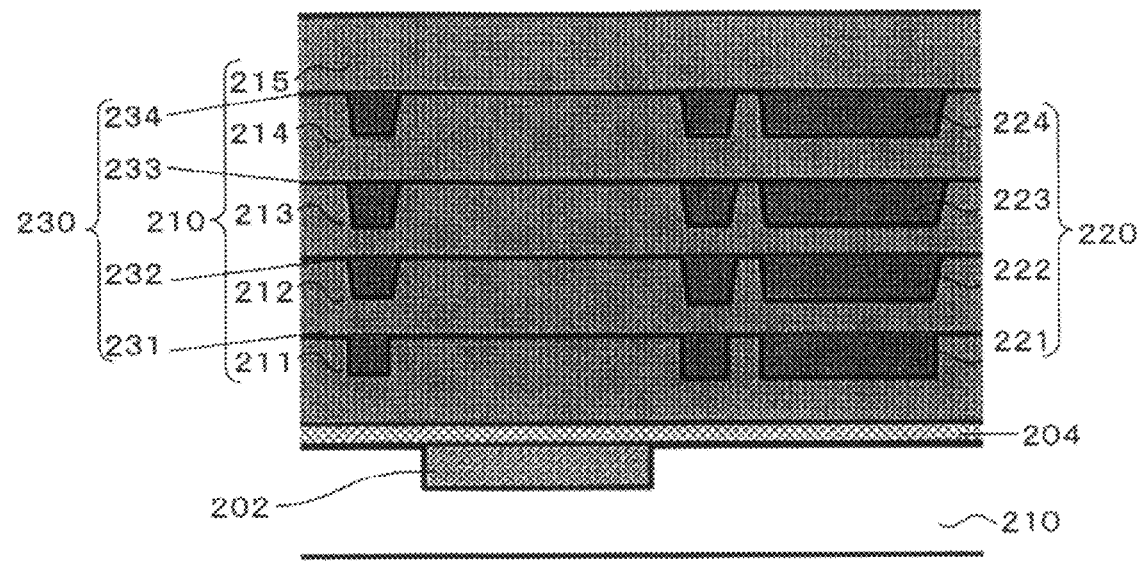
FIG. 3 are diagrams for explaining a second embodiment.
Figure 3:
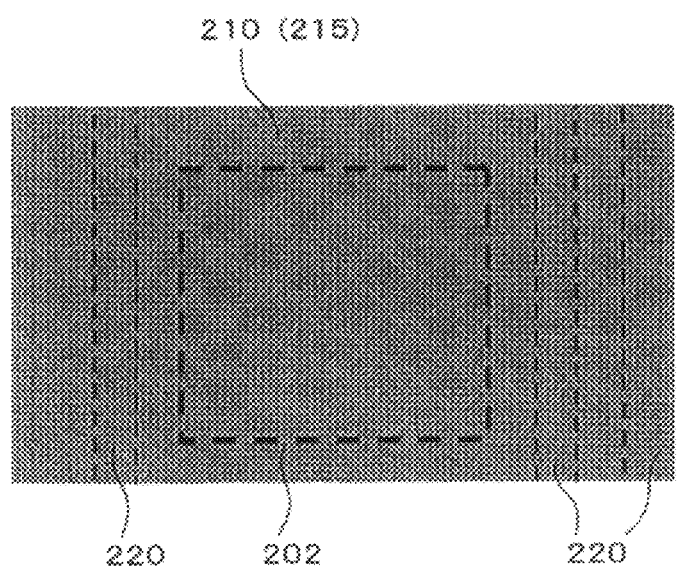
Figure 3A:
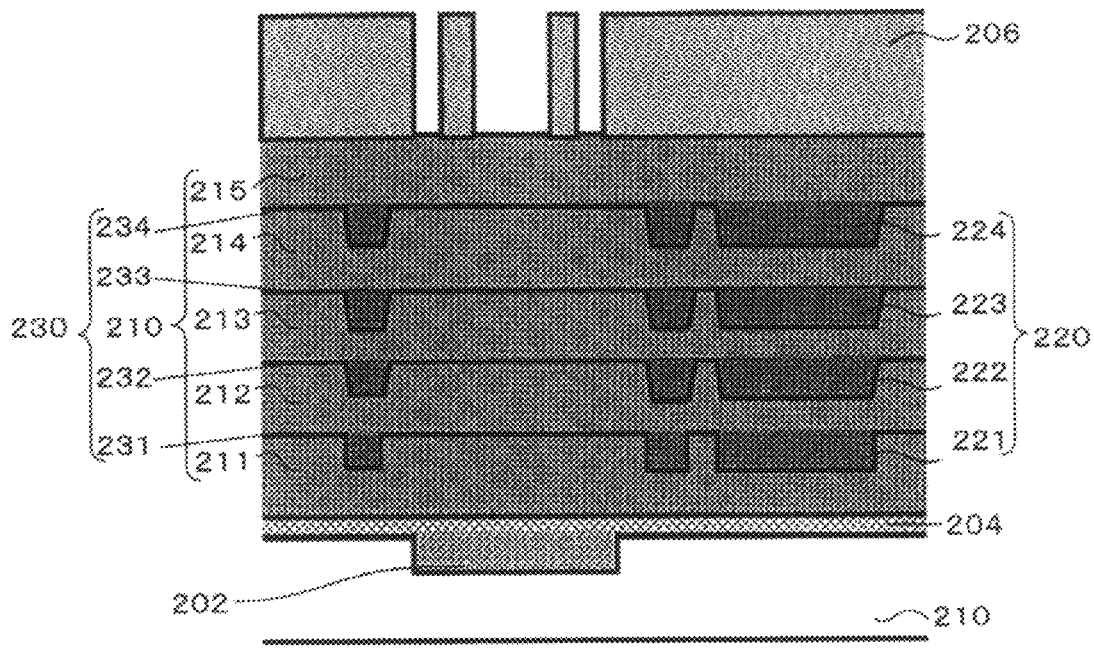
FIG. 3A are diagrams for explaining the second embodiment.
Figure 3A:
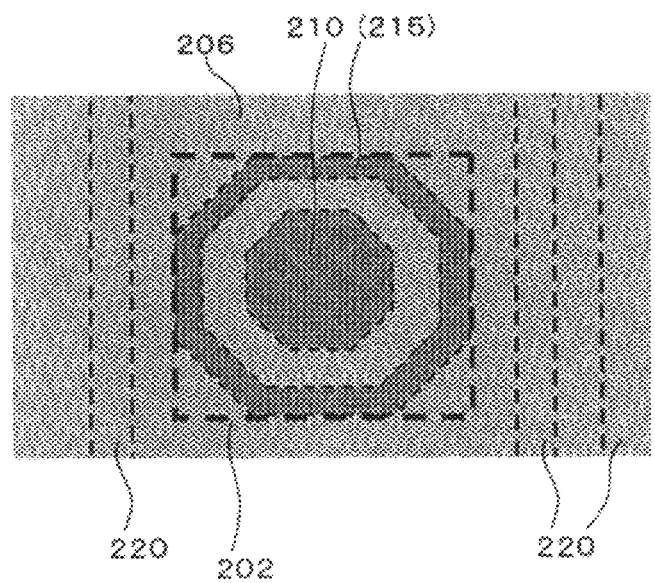
Figure 3B:
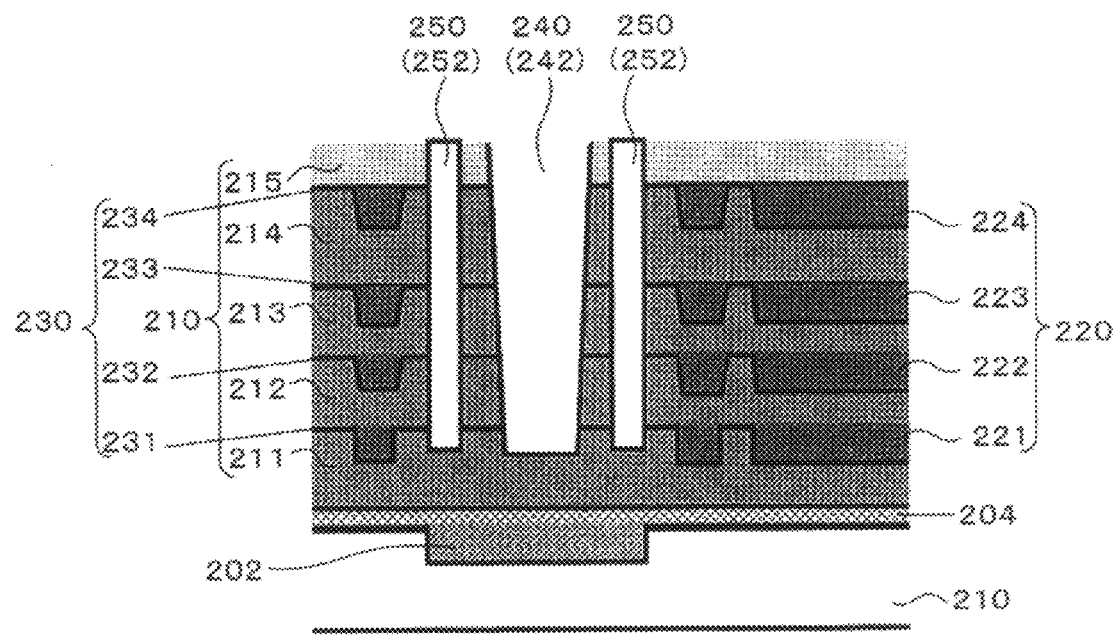
FIG. 3B are diagrams for explaining the second embodiment.
Figure 3B:
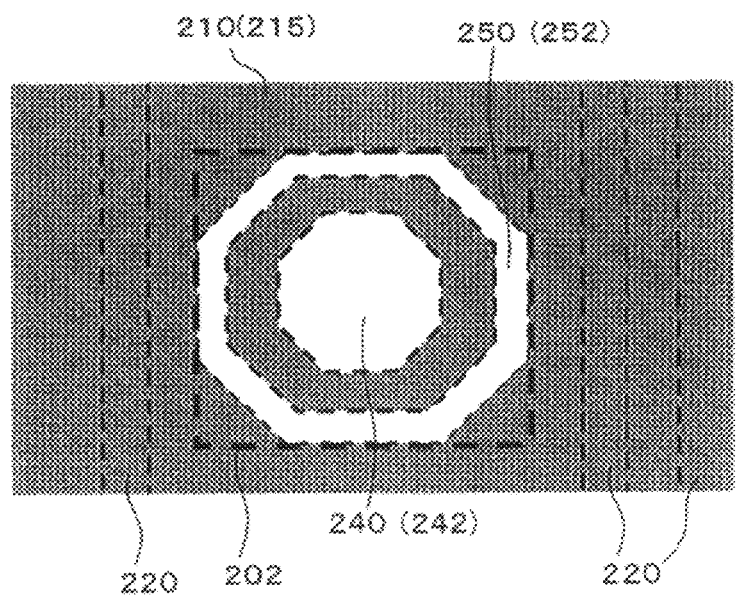
Figure 3C:
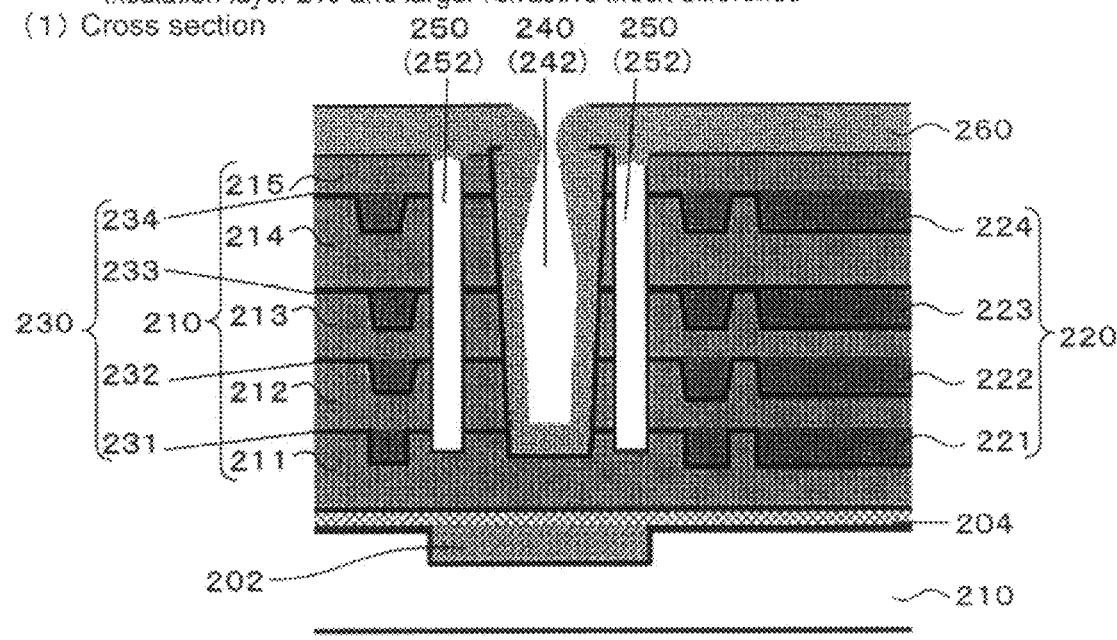
FIG. 3C are diagrams for explaining the second embodiment.
Figure 3C:
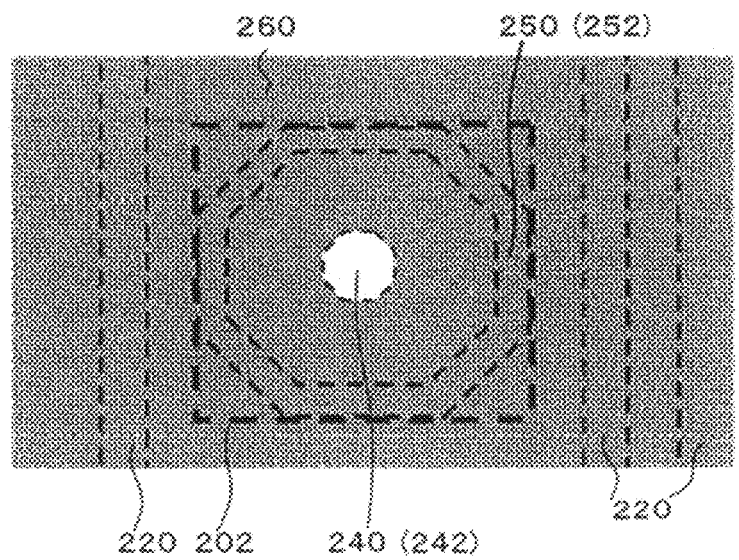
Figure 3D:
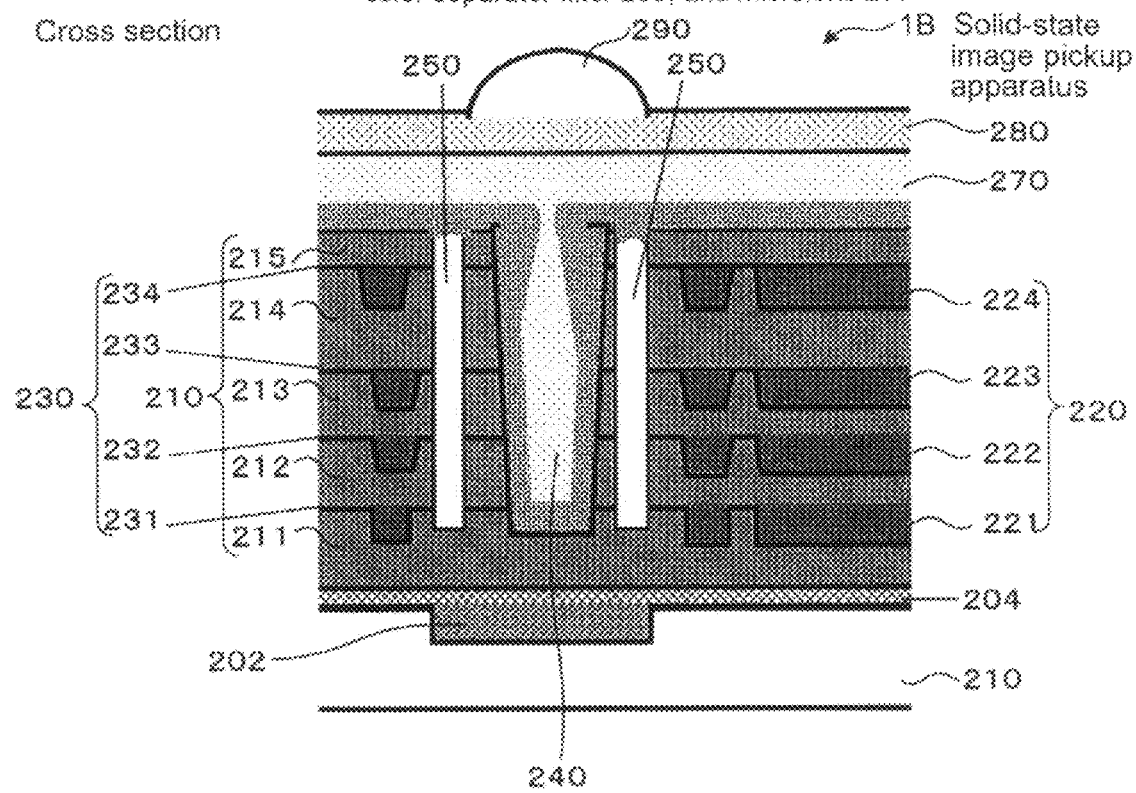
FIG. 3D is a diagram for explaining the second embodiment.

FIGS. 3 to 3D are diagrams for explaining a second embodiment. Components are denoted by numerals in the 200 s, and components that are the same as those of the first embodiment are denoted by the same reference numerals.

A solid-state image pickup apparatus 1B of the second embodiment has characteristics that one hollow portion 250 is provided around a waveguide 240 and a film having a lower permittivity than the silicon oxide film SiO2 is used as the interlayer insulation film. The "film having a lower permittivity than the silicon oxide film SiO2" refers to a film formed of a material having a lower permittivity than the silicon oxide film SiO2.

As shown in FIG. 3, a charge generation portion 202 is first formed on a substrate 200 formed of a semiconductor material such as single-crystal silicon. Although illustrations are omitted, on the substrate 200, a diffusion layer constituting a floating area to which a signal charge generated by the charge generation portion 202 is carried, a pixel signal generation portion constituted of a plurality of transistors, and the like are formed in addition to the charge generation portion 202, for example.

Next, an insulation layer 204 is formed on the substrate 200. On the insulation layer 204, an insulation layer 210 constituted of interlayer insulation films 211 to 215, a metal wiring layer 220 (221 to 224) formed inside the interlayer insulation films 211 to 214, and a barrier insulation layer 230 (231 to 234) provided between the adjacent interlayer insulation films 211 to 215 are formed successively from the lower layer side. The barrier insulation layer 230 functions as a Cu surface protective film (and anti-Cu-diffusion film) for preventing a surface of the metal wiring layer 220 buried into the insulation layer 210 from being oxidized. In fact, the metal wiring layer 220 is formed so that it is not provided above the charge generation portion 202.

The number of layers of the interlayer insulation films 211 to 215 constituting the insulation layer 210, the metal wiring layer 220, and the barrier insulation layer 230 are mere examples. As long as it is a wiring structure necessary for embodying the solid-state image pickup apparatus, the number of layers of the insulation layer 210 and the metal wiring layer 220 and the barrier insulation layer 230 formed via the insulation layer 210 can be increased or decreased.

Here, as the insulation layer 210 (interlayer insulation films 211 to 215), a film formed of a material having a lower permittivity than the silicon oxide film SiO2, such as carbon-containing oxide silicon SiOC and polyallylene PAr is used, for example. Although two materials have been exemplified in this case, any material may be used as long as it has a lower permittivity than the silicon oxide film SiO2.

Next, as shown in FIG. 3A, patterning is performed to form the waveguide 240 and the hollow portion 250 at a position facing the charge generation portion 202. When a pixel pitch is about 1.75 to 1.1 µm pitch, it is desirable for a groove constituting the hollow portion 250 to have a width smaller than 100 nm. A planar shape of the waveguide 240 and the hollow portion 250 is, for example, an octagon.

When performing the patterning for forming the waveguide 240 and the hollow portion 250, a resist 206 is first applied onto the interlayer insulation film 215, and an unnecessary part is removed, for example. At this time, as in the first embodiment, the patterning is performed in a state where the resist 206 does not exist at a part corresponding to the hollow portion 250 so that one hollow portion 250 is formed on an inner side of an outer edge of the charge generation portion 202.

Next, as shown in FIG. 3B, by opening (the interlayer insulation films 211 to 215 of) the insulation layer 210 and the barrier insulation layer 230 (231 to 234) by a dry etching method, an opening portion 242 is formed at the part corresponding to the waveguide 240, and an opening portion 252 is formed at the part corresponding to the hollow portion 250. In other words, in the opening portion forming process, the hollow portion 250 can be processed simultaneous with the waveguide 240.

It should be noted that a size of the opening of the opening portion 242 is larger than that of the opening of the opening portion 252 (e.g., 3 to 5 times). The way of setting the lower limit "3" and the upper limit "5" is the same as that of the first embodiment, and if the current liner condition is applied to the waveguide 240 and the hollow portion 250 having this ratio maintained, it is considered that there is almost no effect of a process variation. A side wall film can be formed on the waveguide 240 with favorable coverage, and a groove of the hollow portion 250 can be prevented from being filled by causing overhang with respect to the hollow portion 250.

For example, the following conditions are conceivable in a case where carbon-containing oxide silicon SiOC is used as the insulation layer 210. A flow ratio of octafluorocyclobutane C4F8, nitrogen N2, and argon Ar is set to be 1:5:10, a pressure is set to be 6.6 Pa (pascal), source power is set to be 2000 W, a substrate bias is set to be 2000 W, a substrate temperature is set at room temperature, and an etching time is set to be about 8 minutes. Accordingly, the opening portion 242 for the waveguide 240 and the opening portion 252 for the hollow portion 250 are formed at the same time.

Next, as shown in FIG. 3C(1), a liner film 260 as an example of the protective layer that integrally covers a wall surface of the opening portion 242 and an uppermost portion of the insulation layer 210 (interlayer insulation film 215 in this example) is formed. A material of the liner film 260 is desirably an optically-transparent material having a higher refractive index than the optically-transparent material of the insulation layer 210, more desirably an optically-transparent material having a larger refractive index difference with respect to the material of the insulation layer 210.

The material and production method are selected so that, even when any of the materials is used for the liner film 260, the side wall film can be formed on the opening portion 242 with favorable coverage and overhang is caused with respect to the opening portion 252 so that the opening portion 252 is not filled. This is for the purpose of forming the hollow portion 250 such that the material of the liner film 260 is deposited on the wall surface (side wall and bottom surface) of the opening portion 242 without omission and the material of the liner film 260 is prevented from entering and filling the opening portion 252 by actively using the overhang phenomenon. Simultaneous with the process of forming the liner film 260 as the protective layer with respect to the opening portion 242 for the waveguide 240, the opening of the opening portion 252 is sealed using the overhang phenomenon while keeping the hollow portion 250 airtight. The opening of the opening portion 242 for the waveguide 240 is not sealed by the overhang phenomenon.

When carbon-containing oxide silicon SiOC is used as the insulation layer 210, a silicon nitride film P—SiN formed by, for example, a plasma CVD method is favorably used as the liner film 260. Manufacturing conditions of the liner film 260 at this time are as follows. A gas flow ratio of silane SiH4, ammonia NH3, and nitrogen N2 is set to be 1:1:20, high-frequency power is set to be 800 W, a pressure is set to be 660 Pa (pascal), a temperature is set at 400° C., and a time is set to be about 1.5 minutes.

Next, as shown in FIG. 3D, an optically-transparent layer 270 formed of an optically-transparent material is formed such that the inside of the waveguide 240 (opening portion 242 covered by liner film 260) is filled therewith and the liner film 260 on the interlayer insulation film 215 is also covered therewith.

An example of the material of the optically-transparent layer 270 is a material having a high optical transmittance such as an acrylic or fluorinated polymer, siloxane of an organic silicon polymer, and polyallylene PAr.

Next, as shown in FIG. 3D, in the case of an application to a color image pickup, a color separator filter 280 and a microlens 290 are formed on the optically-transparent layer 270 in the stated order at a position corresponding to the charge generation portion 202 (i.e., opening portion 242). Accordingly, the solid-state image pickup apparatus 1B of the second embodiment is obtained. In the case of a monochrome image pickup, the color separator filter 280 is unnecessary.

The structure of the second embodiment is different from that of the first embodiment in only the point that the material of the insulation layer 210 is replaced with a material having a lower permittivity than the silicon oxide film SiO2. The method of forming the opening portion 242 for the waveguide 240 and the opening portion 252 for the hollow portion 250, and the like is the same as that of the first embodiment. Thus, the second embodiment basically bears the same effect as the first embodiment.

Moreover, since the material of the insulation layer 210 has a lower permittivity than the silicon oxide film SiO2, an effect of enhancing a conversion efficiency of a photoelectric conversion in the charge generation portion 202 of the solid-state image pickup apparatus 1B can be expected with an effect of reducing a wiring delay time.

Using the refractive index difference between the liner film 260 and the insulation layer 210, an effect of totally reflecting light that has passed through and exited the waveguide 240 (liner film 260) by an interface between the liner film 260 and the insulation layer 210 and causing the light to return to the waveguide 240 can be expected. Moreover, the liner film 260 also has an effect of suppressing corrosive deterioration by preventing water from leaking to the metal wiring layer 220 and an effect of preventing the optically-transparent layer 270 formed thereafter from being deteriorated.

Here, since the refractive index difference between the silicon nitride film P—SiN of the liner film 260 and carbon-containing oxide silicon SiOC of the insulation layer 210 is large, a loss of light exiting the waveguide 240 can be expected to be minimized. It should be noted that even when an oxynitride film P—SiON or a silicon oxide film P—SiO2 formed by the plasma CVD method is used as the liner film 260 in place of the silicon nitride film P—SiN, the refractive index difference with respect to carbon-containing oxide silicon SiOC of the insulation layer 210 can be kept high, and the same effect can therefore be obtained.

(Third Embodiment)

Figure 4:
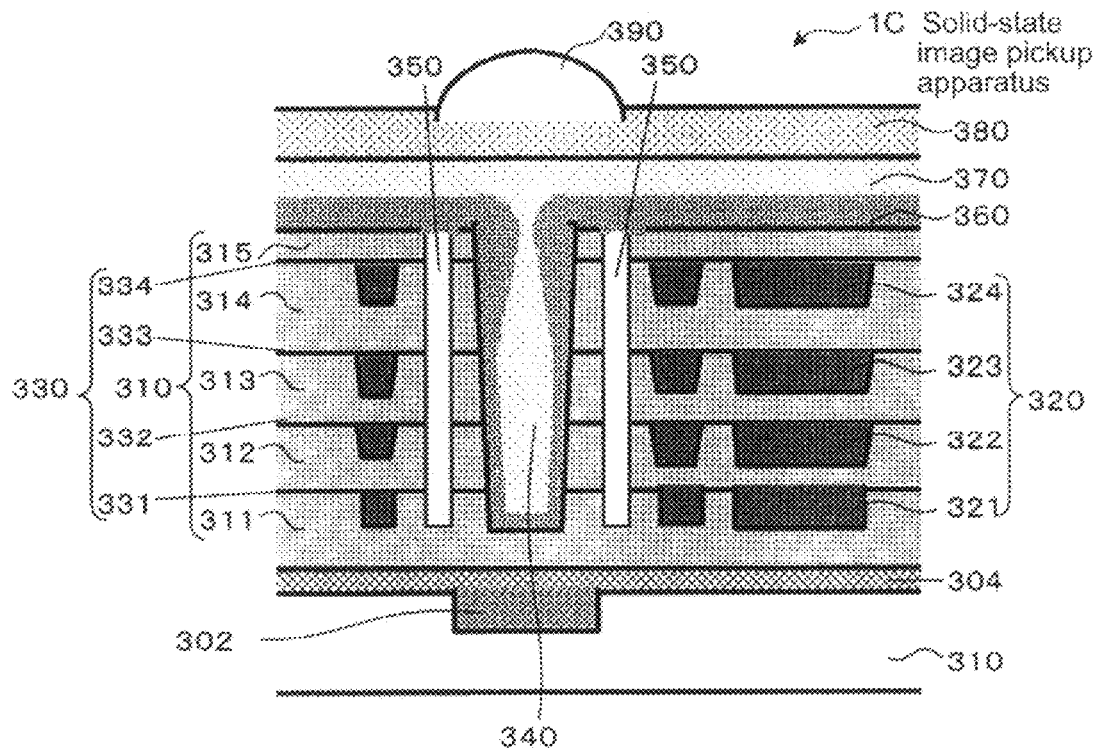
FIG. 4 are diagrams for explaining a third embodiment.
Figure 4:
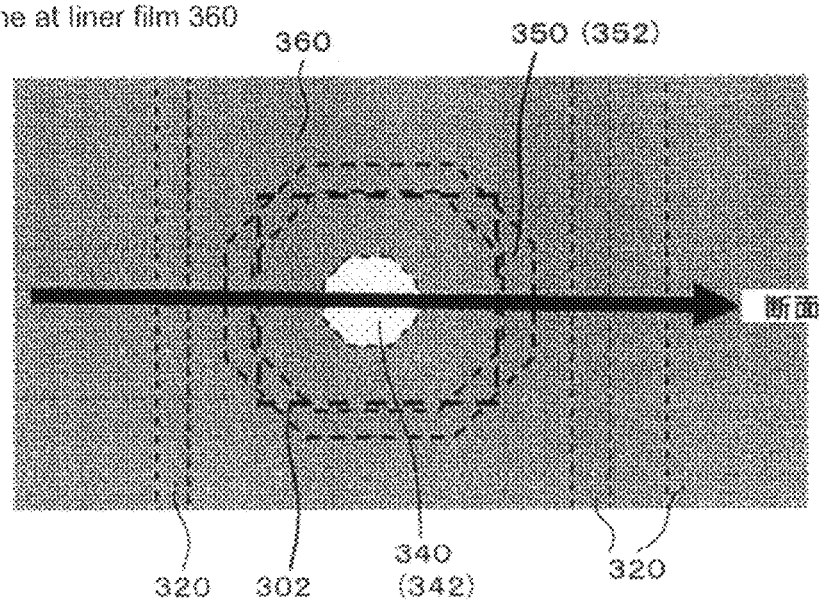
Figure 4A:
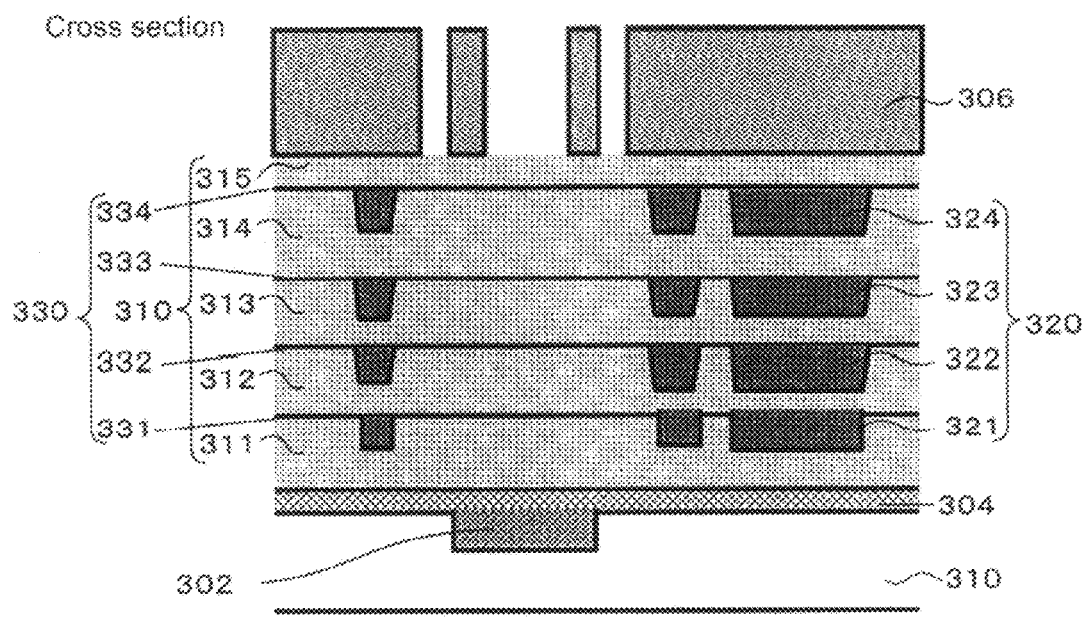
FIG. 4A are diagrams for explaining the third embodiment.
Figure 4A:
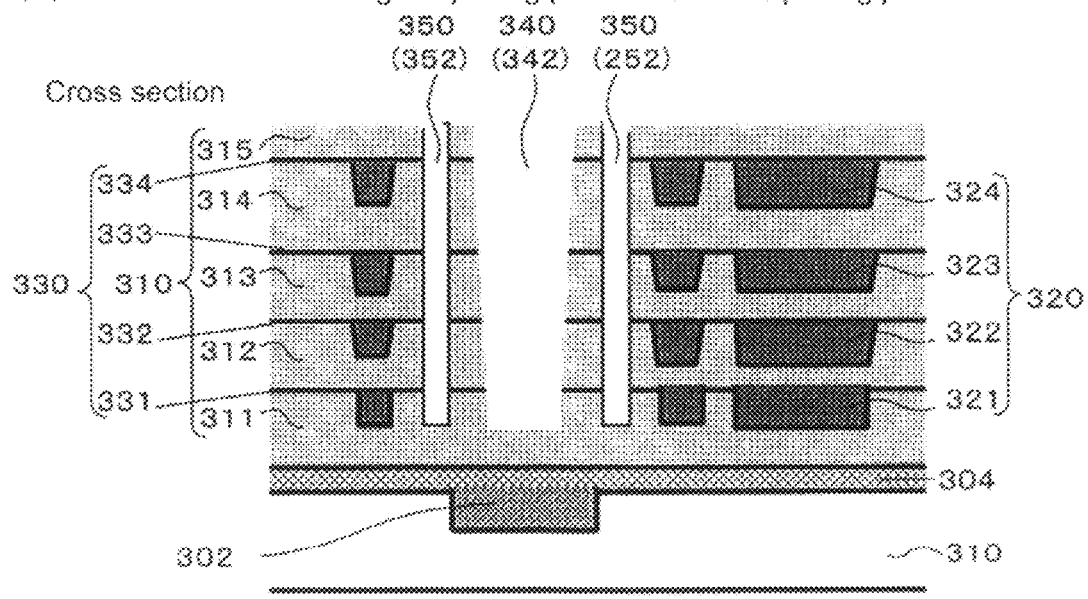

FIGS. 4 and 4A are diagrams for explaining a third embodiment. Components are denoted by numerals in the 300 s, and components that are the same as those of the first embodiment are denoted by the same reference numerals.

A solid-state image pickup apparatus 1C of the third embodiment has characteristics that one hollow portion 350 is provided on an outer side of a charge generation portion 302 and a silicon oxide film is used as an interlayer insulation film. This structure can similarly be applied to the second embodiment above.

A method of forming the hollow portion 350 is basically the same as that of the first embodiment except that a process as shown in FIG. 4A(1) is carried out at a time of performing patterning for forming a waveguide 340 and the hollow portion 350 at a position facing the charge generation portion 302. Specifically, the patterning is performed in a state where a resist 306 does not exist at a part corresponding to the hollow portion 350 so that the hollow portion 350 is provided on an outer side of an outer edge of the charge generation portion 302.

Next, as shown in FIG. 4A(2), by opening (interlayer insulation films 311 to 315 of) an insulation layer 310 and a barrier insulation layer 330 (331 to 334) by a dry etching method, an opening portion 342 for the waveguide 340 and an opening portion 352 for the hollow portion 350 are formed at the same time.

Since a process of forming the hollow portion 350 does not need to be provided in addition to the process of forming the waveguide 340, the solid-state image pickup apparatus 1C can be produced with a small number of processes, with the result that costs can be cut. Moreover, since the material of the insulation layer 310 is interposed between the waveguide 340 and the hollow portion 350, the number of reflection interfaces is increased as compared to Patent Document 2, and an effect of causing light that has deviated from the charge generation portion 302 to return to the charge generation portion 302 is additionally enhanced.

In addition, since the hollow portion 350 is provided on the outer side of the outer edge of the charge generation portion 302 in the solid-state image pickup apparatus 1C of the third embodiment, there is the following difference in the operational effect with respect to the solid-state image pickup apparatus 1A of the first embodiment. Specifically, since the hollow portion 350 is provided on the outer side of the charge generation portion 302 as an example of the light-receiving portion, oblique light that enters at a low angle and that has originally been leaked can be led to the charge generation portion 302 without omission.

(Fourth Embodiment)

Figure 5:
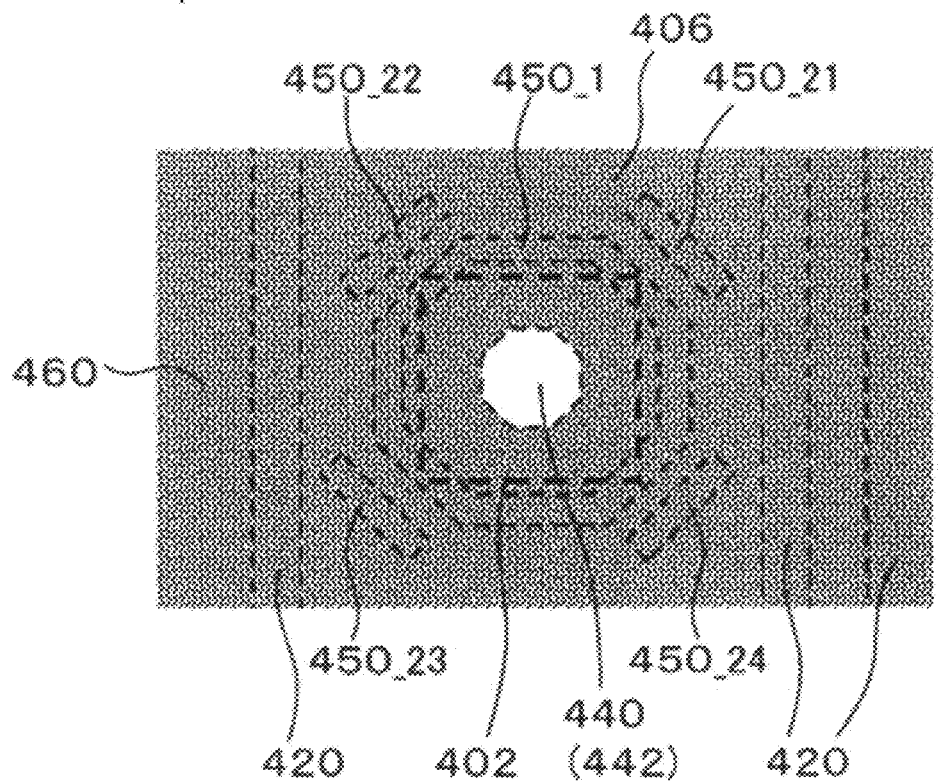
FIG. 5 is a diagram for explaining a fourth embodiment.
Figure 5A:
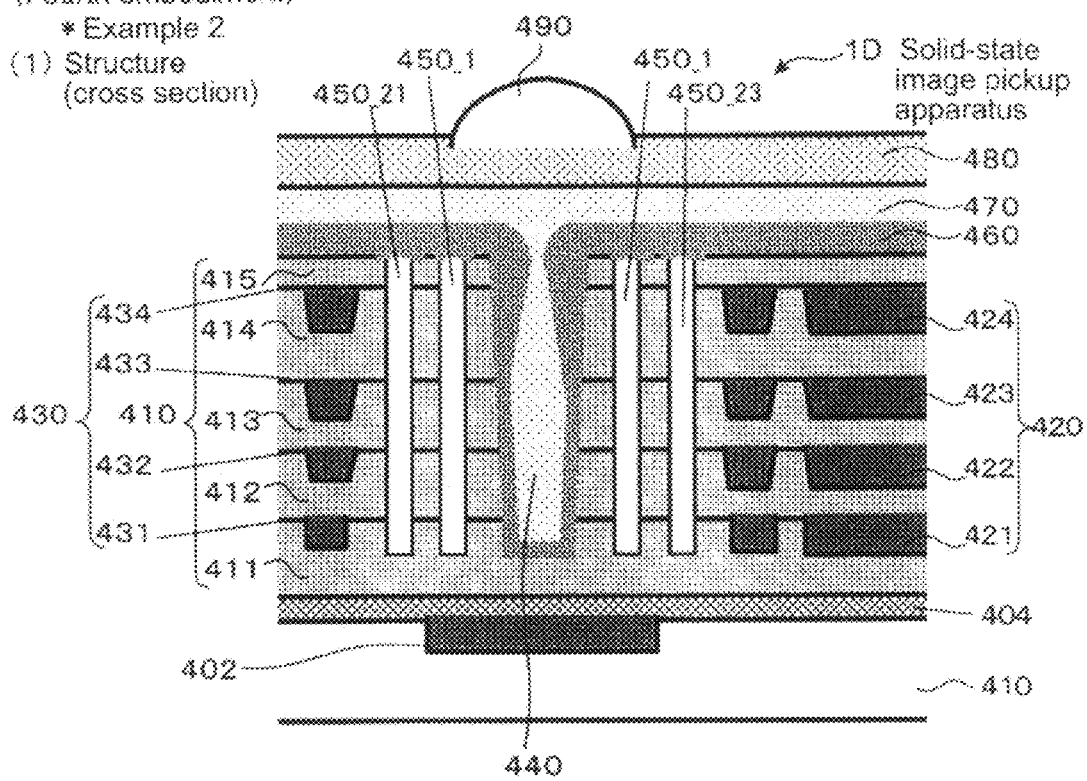
FIG. 5A are diagrams for explaining the fourth embodiment.
Figure 5A:
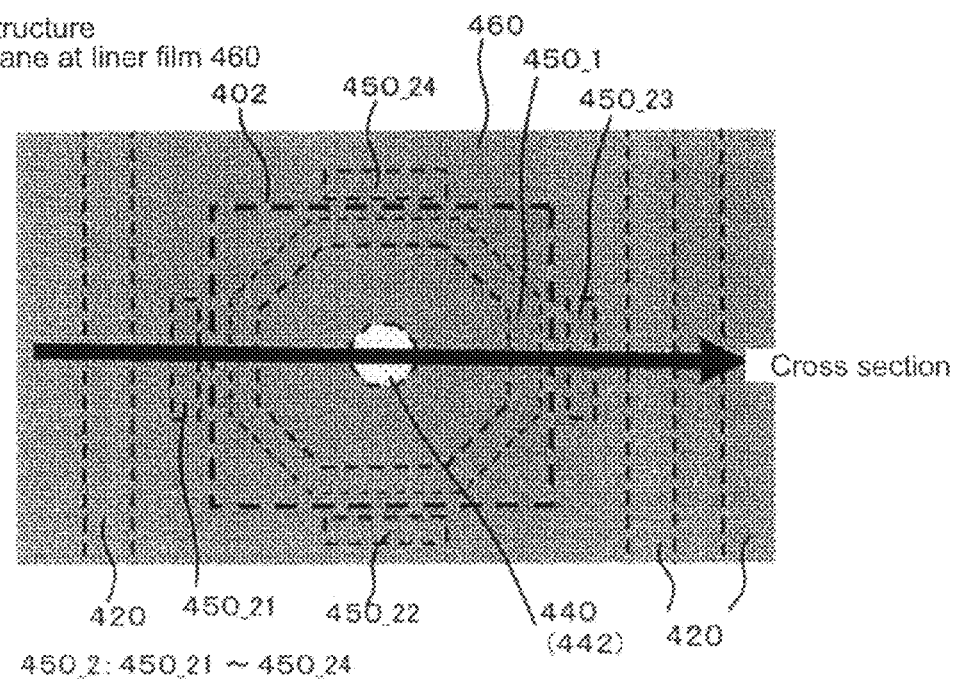
Figure 5B:
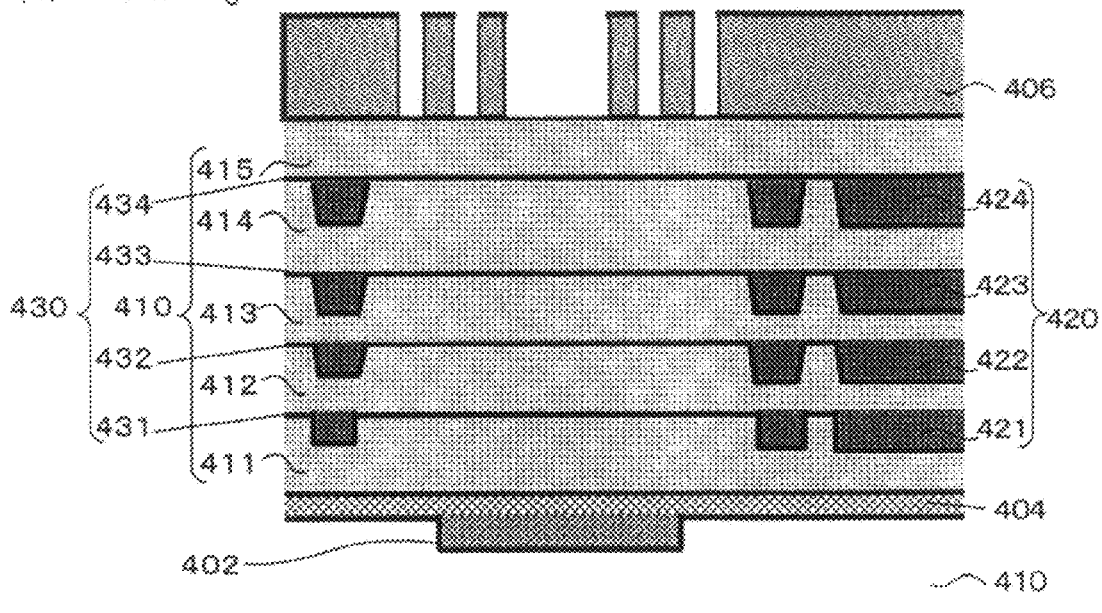
FIG. 5B are diagrams for explaining the fourth embodiment.
Figure 5B:
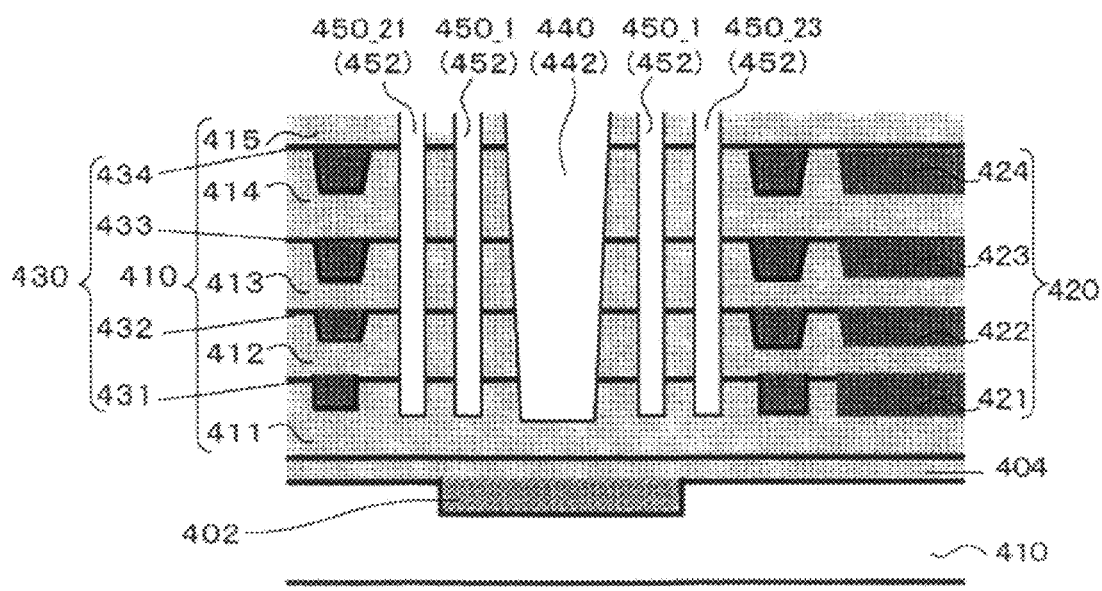
Figure 6:
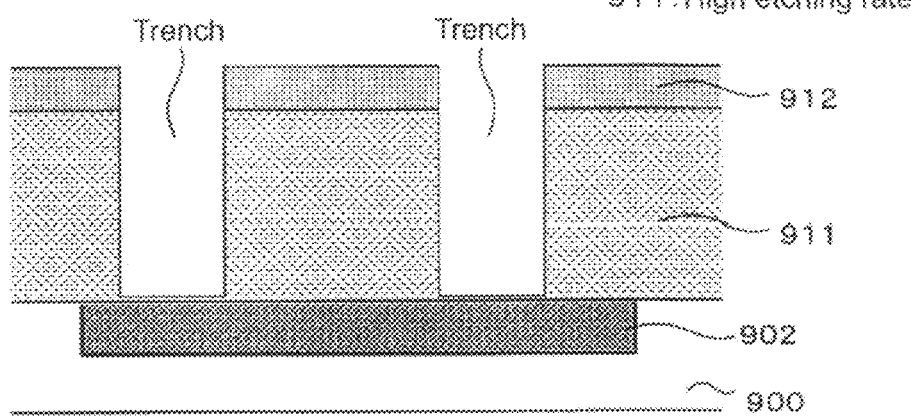
FIG. 6 are diagrams for explaining a structure of Patent Document 1.
Figure 6:
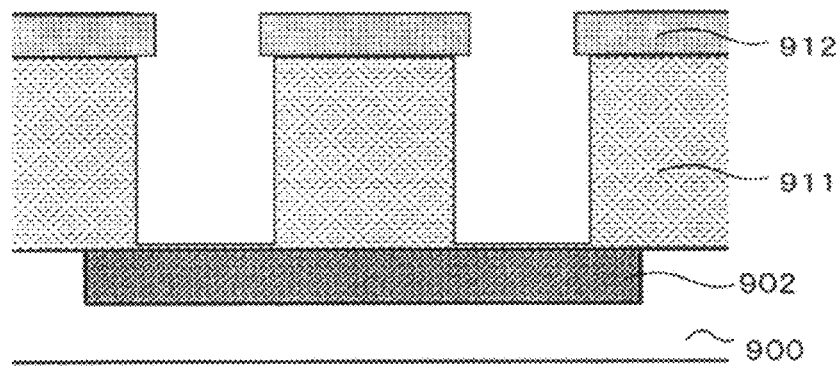
Figure 6:
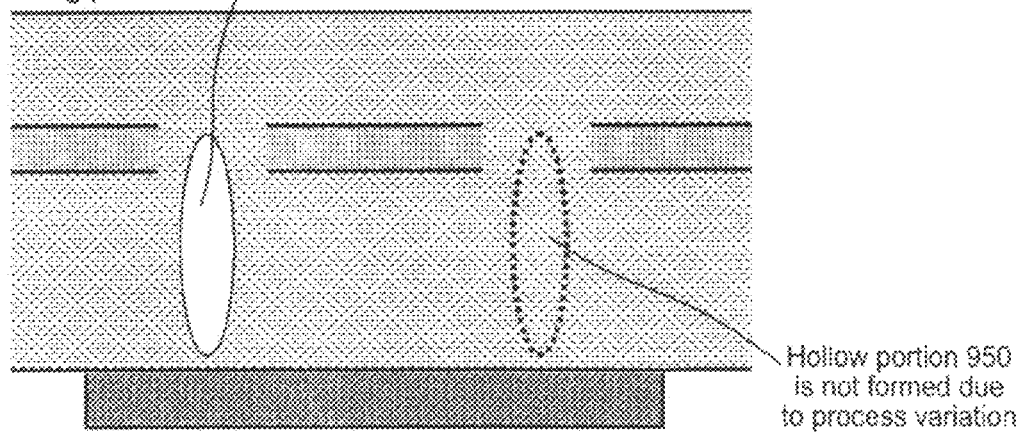
Figure 6A:
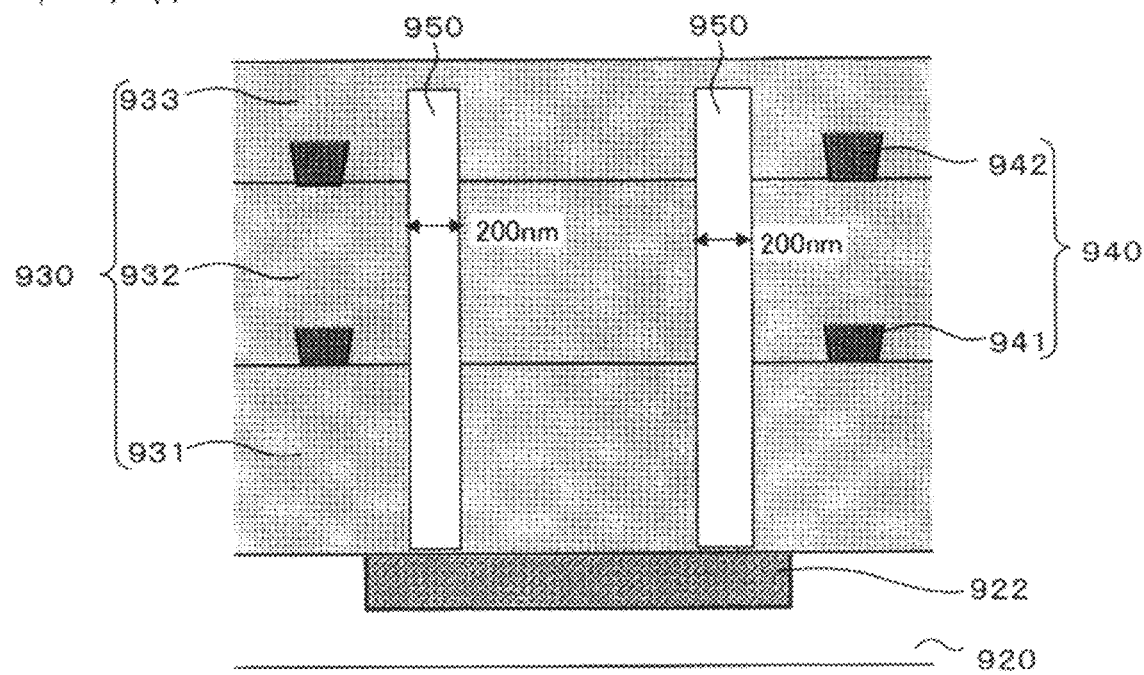
FIG. 6A are diagrams for explaining another structure of Patent Document 1.

FIGS. 5 to 5B are diagrams for explaining a fourth embodiment. Components are denoted by numerals in the 400 s, and components that are the same as those of the first embodiment are denoted by the same reference numerals.

A solid-state image pickup apparatus 1D of the fourth embodiment has characteristics that a plurality of hollow portions 450 are provided annularly around a waveguide 440 and a silicon oxide film is used as an interlayer insulation film. In other words, the solid-state image pickup apparatus 1D has characteristics that the hollow portion 450 is provided plurally with respect to a single charge generation portion 402. This structure can similarly be applied to the second embodiment above.

The state where the plurality of hollow portions 450 are provided annularly only needs to refer to a state where a ring is generally formed as a whole as seen in plan view, and the ring may be partially broken.

For example, in Example 1 shown in FIG. 5, a first octagonal hollow portion 450_1 is provided so as to basically surround an outer edge of a rectangular charge generation portion 402. A second hollow portion 450_2 is provided on an outer side of the first hollow portion 450_1. The hollow portion 450_2 is constituted of hollow portions 450_21, 450_22, 450_23, and 450_24 provided at positions respectively corresponding to four corners of the charge generation portion 402 while the four hollow portions are set apart at positions respectively facing four sides of the charge generation portion 402.

In Example 2 shown in FIG. 5A, the first octagonal hollow portion 450_1 is provided on an inner side of the outer edge of the rectangular charge generation portion 402 while basically being in internal contact therewith. The second hollow portion 450_2 is provided on the outer side of the first hollow portion 450_1. The second hollow portion 450_2 is constituted of the hollow portions 450_21, 450_22, 450_23, and 450_24 provided at positions respectively facing the four sides of the charge generation portion 402 while the four hollow portions are set apart at positions respectively corresponding to the four corners of the charge generation portion 402.

In both of Examples 1 and 2, the second hollow portion 450_2 is broken along the ring shape, but the four hollow portions 450_21, 450_22, 450_23, and 450_24 are basically arranged in a ring shape as a whole as seen in plan view. The four hollow portions 450_21, 450_22, 450_23, and 450_24 may be connected to thus form a full ring like the first hollow portion 450_1.

A method of forming the plurality of hollow portions 450 is basically the same as that of the first embodiment except that a process as shown in FIG. 5B(1) is carried out at a time of performing patterning for forming the waveguide 440 and the hollow portions 450 at a position facing the charge generation portion 402.

The patterning is performed in a state where a resist 406 does not exist at a part corresponding to the first hollow portion 450_1 so that the hollow portion 450_1 is provided on an inner side of the outer edge of the charge generation portion 402. In addition, the patterning is performed in a state where the resist 406 does not exist at a part corresponding to other hollow portions 450_x (hollow portion 450_2: hollow portions 450_21, 450_22, 450_23, and 450_24) surrounding the hollow portion 450_1. FIG. 5B show the case of Example 2 shown in FIG. 5A.

Next, as shown in FIG. 5B(2), by opening (interlayer insulation films 411 to 415 of) an insulation layer 410 and a barrier insulation layer 430 (431 to 434) by a dry etching method, an opening portion 442 for the waveguide 440 and opening portions 452 for the hollow portions 450 are formed at the same time.

Since a process of forming the hollow portions 450 does not need to be provided in addition to the process of forming the waveguide 440, the solid-state image pickup apparatus 1D can be produced with a small number of processes, with the result that costs can be cut. Moreover, since the material of the insulation layer 410 is interposed between the waveguide 440 and the hollow portions 450, the number of reflection interfaces is increased as compared to Patent Document 2, and an effect of causing light that has deviated from the charge generation portion 402 to return to the charge generation portion 402 is additionally enhanced.

In addition, since the plurality of hollow portions 450 are provided with respect to a single charge generation portion 402 in the solid-state image pickup apparatus 1D of the fourth embodiment, there is the following difference in the operational effect with respect to the solid-state image pickup apparatus 1A of the first embodiment. Specifically, since the hollow portion is provided plurally, the number of interfaces is additionally increased, and oblique light that enters at a low angle and that has originally been leaked can be led to the charge generation portion 402 as an example of the light-receiving portion without omission. Moreover, by closing in light between the hollow portion 450_1 and the hollow portion 450_21 or between the hollow portion 450_1 and the hollow portion 450_22 as shown in FIG. 5A, it is possible to prevent (block) light from entering an adjacent pixel.

The embodiments of the present invention have been described heretofore. However, the technical scope of the present invention is not limited to those described in the above embodiments, and various modifications and improvements can be added to the above embodiments without departing from the gist of the present invention. Embodiments to which such modifications and improvements are added are also contained in the technical scope of the present invention.

Moreover, the above embodiments do not limit the inventions according to the claims, and not all the combinations of the features described in the above embodiments are necessarily essential as solving means of the invention. The above embodiments include inventions of various stages, and various inventions can be extracted by appropriate combinations of a plurality of disclosed constituent elements. Even when some constituent elements are removed from the entire constituent elements disclosed in the embodiments, the structure from which those constituent elements are removed may be extracted as the invention insofar as the effects can be obtained.

For example, in the above embodiments, the color separator filter 180 and the microlens 190 have been formed on the optically-transparent layer 170. However, the color separator filter 180 and the microlens 190 do not always need to be provided. It should be noted, however, that when the microlens 190 is omitted, a light collection efficiency is lowered since light guide is realized with the waveguide 140 alone.

Furthermore, in the above embodiments, the barrier insulation layer 130 has been interposed between the insulation layer 110 and the metal wiring layer 120. However, when the metal wiring layer 120 does not have the copper wiring structure, the barrier insulation layer 130 is unnecessary.

What is claimed is:

1. A solid-state image pickup apparatus, comprising:
   a substrate in which a charge generation portion that generates a signal charge is formed on a surface layer;
   a layer covering an upper surface of the substrate;
   a waveguide formed in the layer covering the upper surface of the substrate at a position corresponding to the charge generation portion;
   a hollow portion formed in the layer covering the upper surface of the substrate at a position on an outer side of the waveguide; and
   an optically-transparent layer formed on the layer covering the upper surface of the substrate such that at least the hollow portion becomes airtight.

2. The solid-state image pickup apparatus according to claim 1,
   wherein the waveguide is filled with an optically-transparent material.

3. The solid-state image pickup apparatus according to claim 2,
   wherein the waveguide is partially filled with an optically-transparent protective layer that integrally covers a wall surface of the waveguide and an upper surface of the layer covering the upper surface of the substrate, and a remaining portion of the waveguide is filled with an optically-transparent material different from a material of the protective layer.

4. The solid-state image pickup apparatus according to claim 3,
   wherein the protective layer is formed of a material having a higher refractive index than the layer covering the upper surface of the substrate.

5. The solid-state image pickup apparatus according to claim 1,
   wherein the layer covering the upper surface of the substrate is formed of a material having a lower permittivity than a silicon oxide film.

6. The solid-state image pickup apparatus according to claim 1,
   wherein the layer covering the upper surface of the substrate includes an interlayer insulation film, a metal wiring layer that uses copper as a wiring material, and an insulation film that is interposed between the interlayer insulation film and the metal wiring layer and suppresses an ion diffusion of the copper.

7. The solid-state image pickup apparatus according to claim 1,
   wherein the hollow portion is provided at a position on an outer side of an outer edge of the charge generation portion.

8. The solid-state image pickup apparatus according to claim 1,
   wherein the hollow portion is provided plurally.

9. A method of producing a solid-state image pickup apparatus, comprising the steps of:
   forming, on a substrate in which a charge generation portion that generates a signal charge is formed on a surface layer, a layer covering an upper surface of the substrate;
   forming in the layer covering the upper surface of the substrate, an opening portion for a waveguide at a position corresponding to the charge generation portion and an opening portion for a hollow portion on an outer side of the waveguide; and
   forming an optically-transparent layer on the layer covering the upper surface of the substrate and sealing an opening of the opening portion for the hollow portion by the optically-transparent layer such that the opening portion becomes airtight.

10. The method of producing a solid-state image pickup apparatus according to claim 9, further comprising the step of filling the opening portion for the waveguide with an optically-transparent material.

11. The method of producing a solid-state image pickup apparatus according to claim 9,
    wherein the step of sealing the opening of the opening portion for the hollow portion such that the opening portion becomes airtight is realized by forming an optically-transparent protective layer such that an upper surface of the layer covering the upper surface of the substrate and a wall surface of the opening portion for the waveguide are covered and the opening of the opening portion for the hollow portion is sealed while keeping the opening portion airtight.

12. The method of producing a solid-state image pickup apparatus according to claim 11,
    wherein the step of forming the protective layer includes at least one of a setting of a material of the protective layer and a setting of manufacturing conditions on a gas flow ratio, high-frequency power, a pressure, and a temperature so that the protective layer is overhung at the opening of the opening portion for the hollow portion to thus seal the opening of the opening portion for the hollow portion such that the opening portion becomes airtight.

13. The method of producing a solid-state image pickup apparatus according to claim 11,
    wherein the step of forming the protective layer includes at least one of a setting of a material of the protective layer and a setting of manufacturing conditions on a gas flow ratio, high-frequency power, a pressure, and a temperature so that the opening of the opening portion for the waveguide is not sealed at a time the protective layer is overhung at the opening of the opening portion for the waveguide.

14. The method of producing a solid-state image pickup apparatus according to claim 11,
wherein the protective layer is formed of a material having a higher refractive index than the layer covering the upper surface of the substrate.

15. The method of producing a solid-state image pickup apparatus according to claim 9,
wherein the step of forming the layer covering the upper surface of the substrate includes forming the layer covering the upper surface of the substrate using a material having a lower permittivity than a silicon oxide film.

16. The method of producing a solid-state image pickup apparatus according to claim 9,
wherein the step of forming the layer covering the upper surface of the substrate includes forming an interlayer insulation film, forming a metal wiring layer using copper as a wiring material, and forming an insulation film that suppresses an ion diffusion of the copper between the interlayer insulation film and the metal wiring layer.

* * * * *